United States Patent
Kim et al.

(12)

(10) Patent No.: US 6,207,484 B1
(45) Date of Patent: Mar. 27, 2001

(54) METHOD FOR FABRICATING BICDMOS DEVICE AND BICDMOS DEVICE FABRICATED BY THE SAME

(75) Inventors: Jong-Hwan Kim, Bucheon; Suk-Kyun Lee, Incheon; Yong-Cheol Choi; Chul-Joong Kim, both of Bucheon, all of (KR)

(73) Assignee: Samsung Electronics, Co., Ltd., Suwon (KR)

( * ) Notice: Subject to any disclaimer, the term of this patent is extended or adjusted under 35 U.S.C. 154(b) by 0 days.

(21) Appl. No.: 09/409,914

(22) Filed: Sep. 30, 1999

(30) Foreign Application Priority Data

Sep. 30, 1998 (KR) .................................................. 98-41067

(51) Int. Cl.[7] .............................................. H01L 21/8238
(52) U.S. Cl. .......................... 438/209; 438/202; 438/227; 438/298
(58) Field of Search .................................. 438/227, 298, 438/202, 209

(56) References Cited

U.S. PATENT DOCUMENTS

| 4,277,291 | * | 7/1981 | Cerofolini et al. . | |
| 4,391,650 | * | 7/1983 | Pfeifer et al. . | |
| 5,427,964 | * | 6/1995 | Kaneshiro et al. . | |
| 5,441,902 | * | 8/1995 | Hsieh et al. . | |
| 5,618,688 | * | 4/1997 | Reuss et al. | 438/189 |
| 5,926,704 | * | 7/1999 | Choi et al. | 438/227 |

OTHER PUBLICATIONS

A. Nezar et al., "A Submicron Bi–CMOS–DMOS Process for 20–30 and 50V Applications", Advanced Technology Development, Philips Semiconductors, pp. 333–336 No Date.

* cited by examiner

*Primary Examiner*—Long Pham
(74) *Attorney, Agent, or Firm*—Marger Johnson & McCollom, P.C.

(57) ABSTRACT

A method for fabricating a BiCDMOS device where bipolar, CMOS and DMOS transistors are formed on a single wafer is provided. A semiconductor region of a second conductivity type is formed on a semiconductor substrate of a first conductivity type. Well regions of first and second conductivity types are formed within the semiconductor region. Then, an oxidation passivation layer pattern defining a region where a pad oxide layer and a field oxide layer are to be formed is formed on a surface of the substrate where the well regions have been formed. Impurity ions of the first conductivity type are implanted into the entire surface of a region where the field oxide layer is to be formed, using the oxidation passivation layer pattern as an ion implantation mask. An ion implantation mask pattern defining a field region of the second conductivity type is formed on the substrate where the oxidation passivation layer has been formed. Impurity ions of the second conductivity type are implanted, using the ion implantation mask pattern. Then, the ion implantation mask pattern is removed. The field oxide layer is formed by annealing, using the oxidation passivation layer pattern, and simultaneously field regions of the first and the second conductivity types are formed.

6 Claims, 45 Drawing Sheets

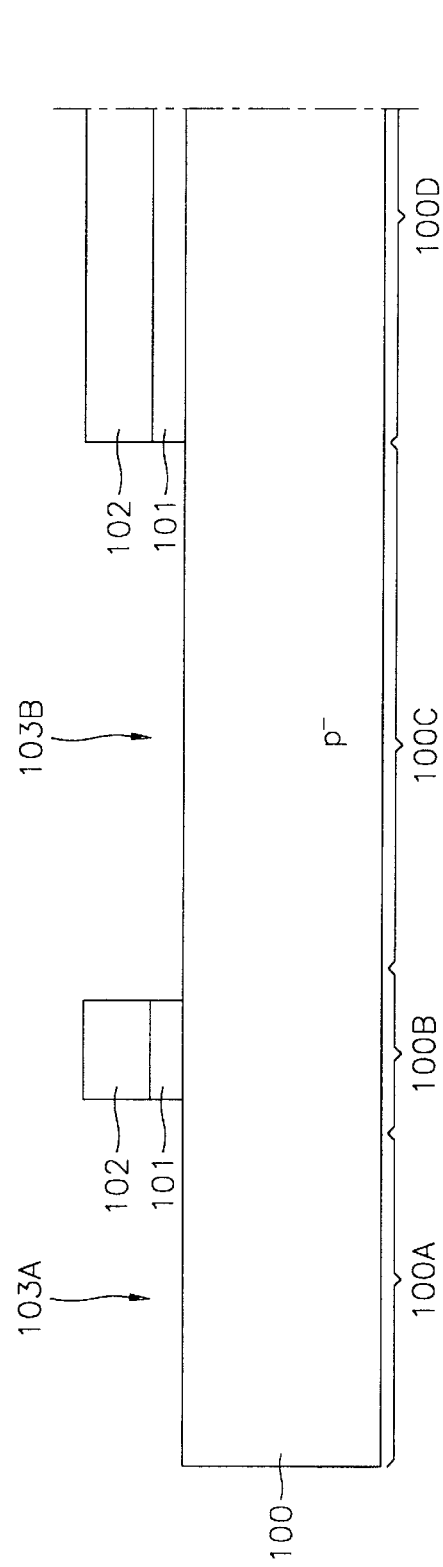
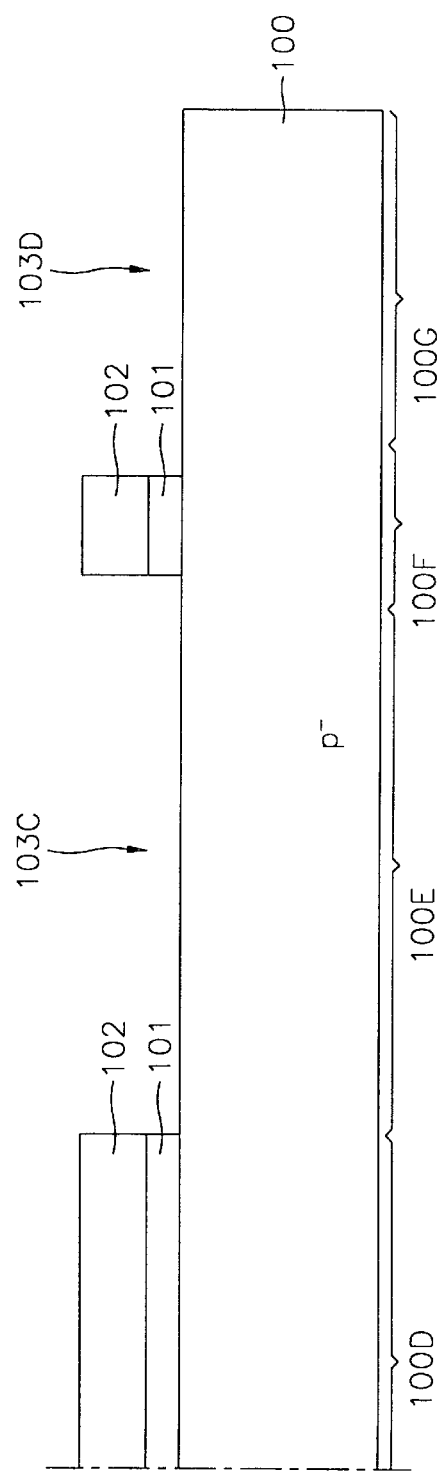

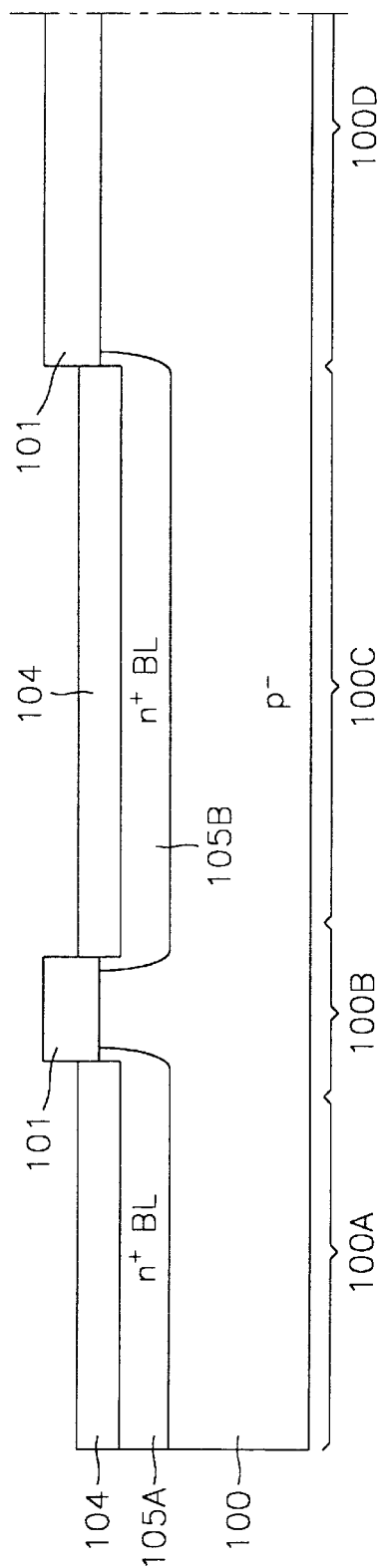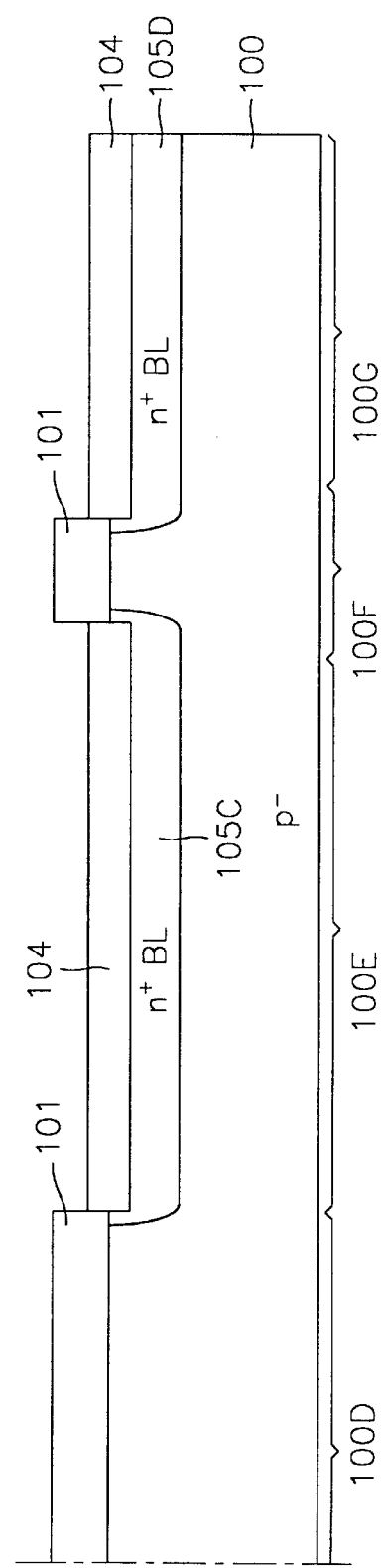

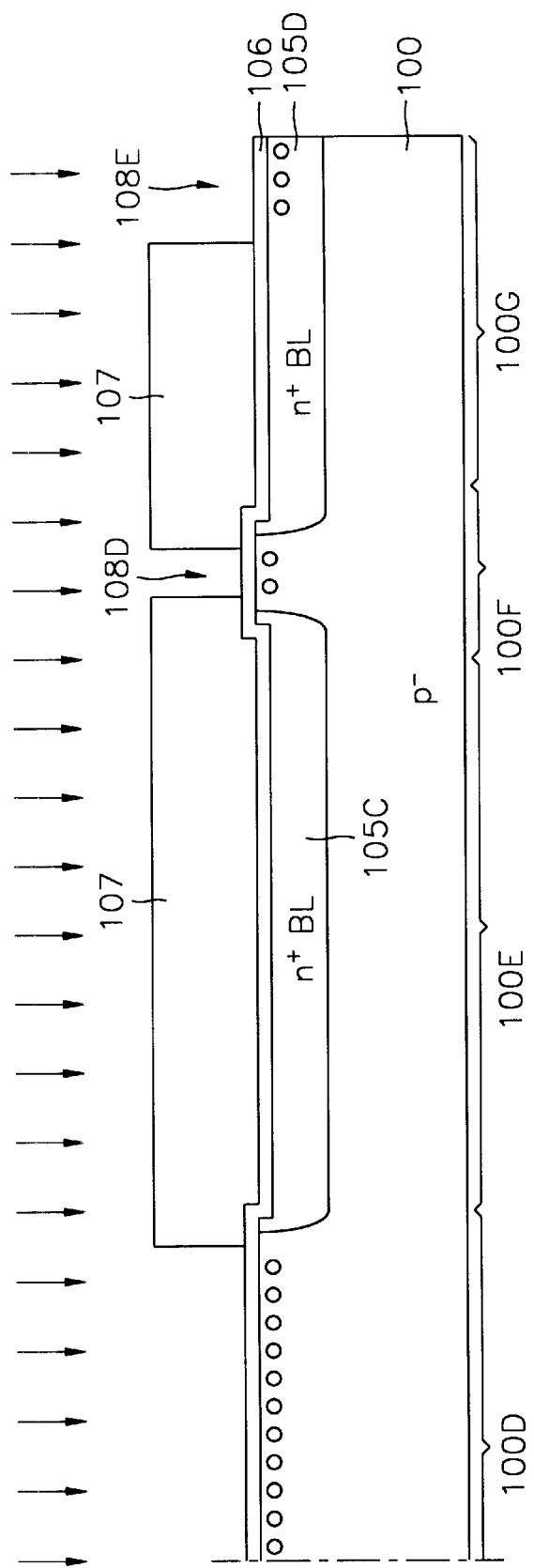

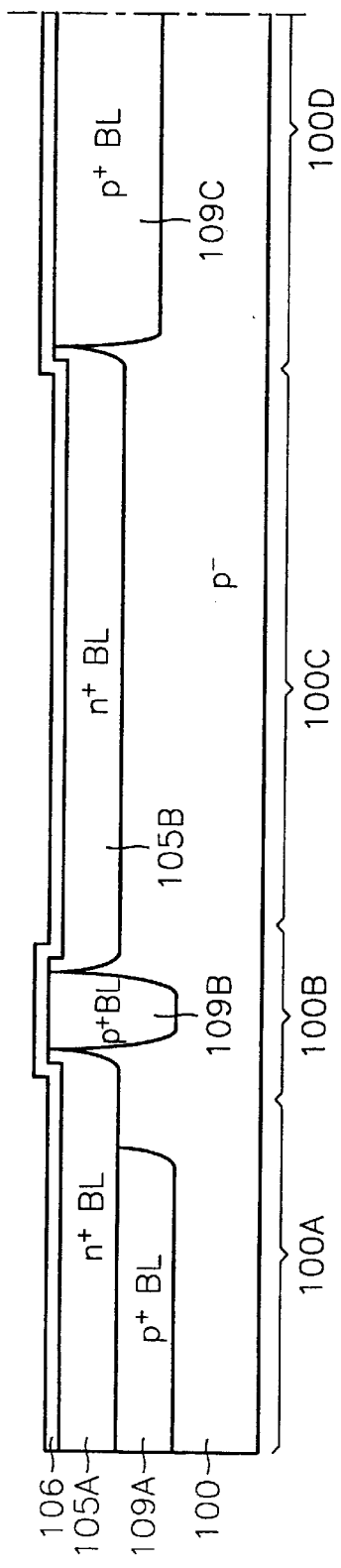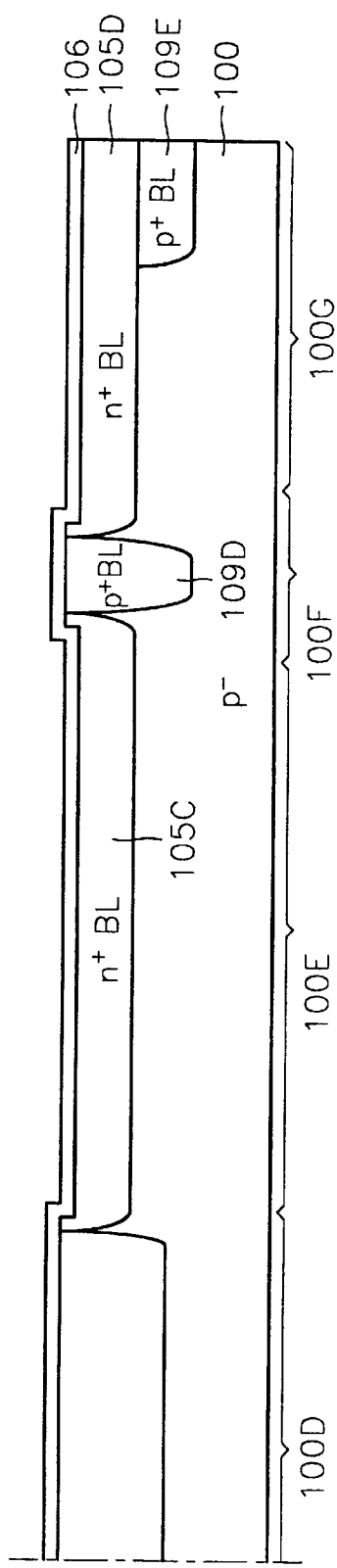
FIG. 5A
FIG. 5B

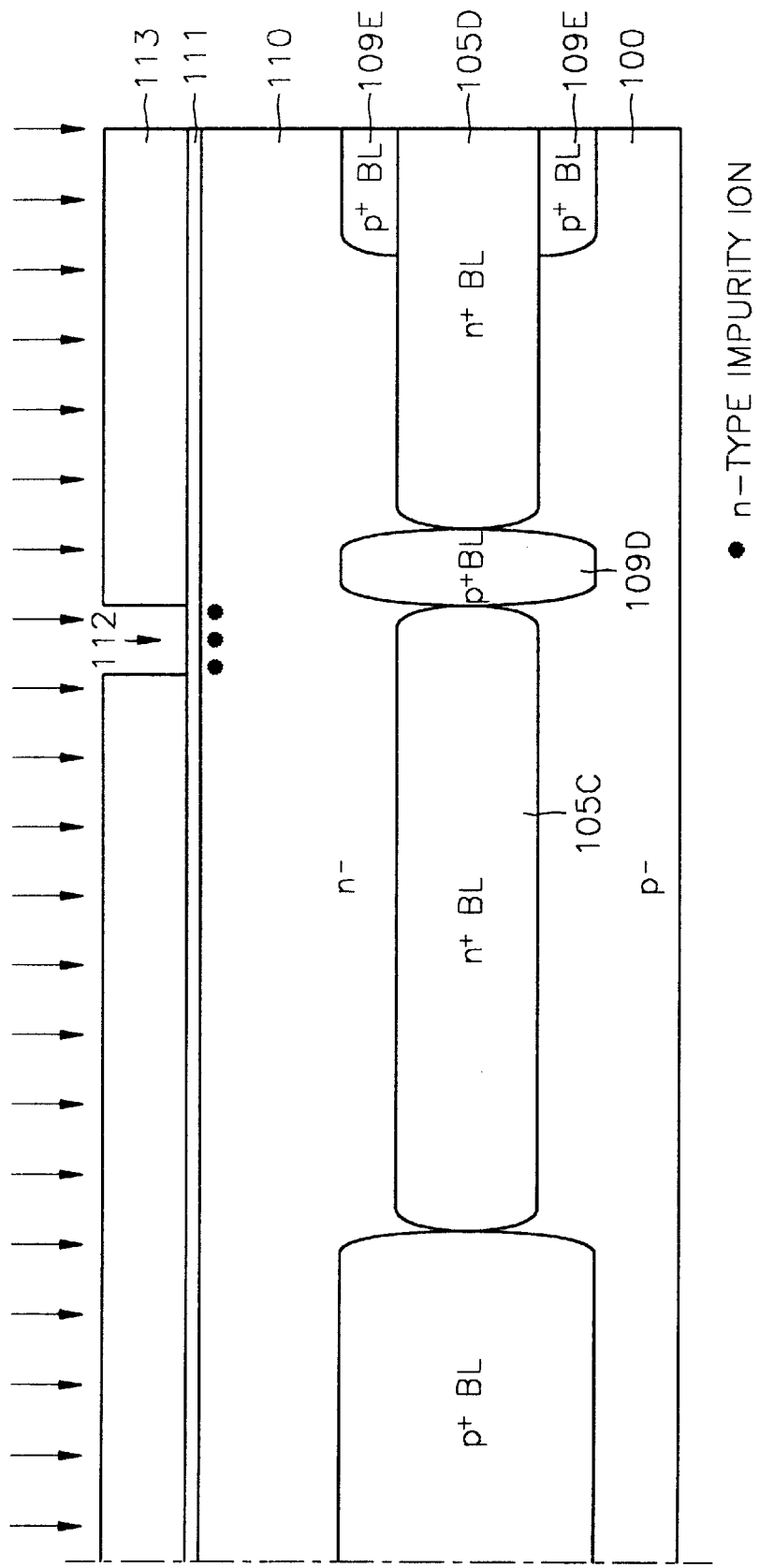

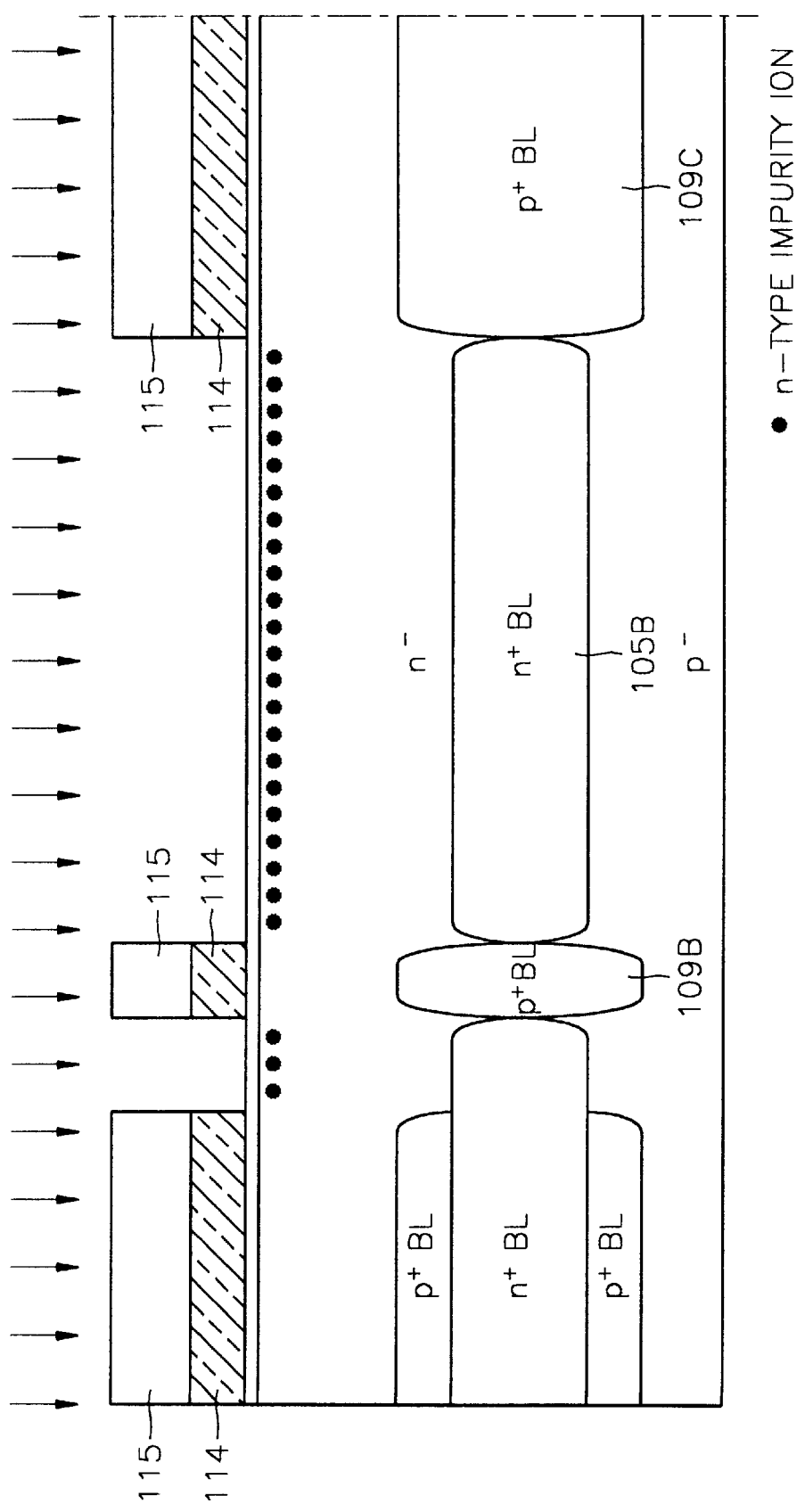

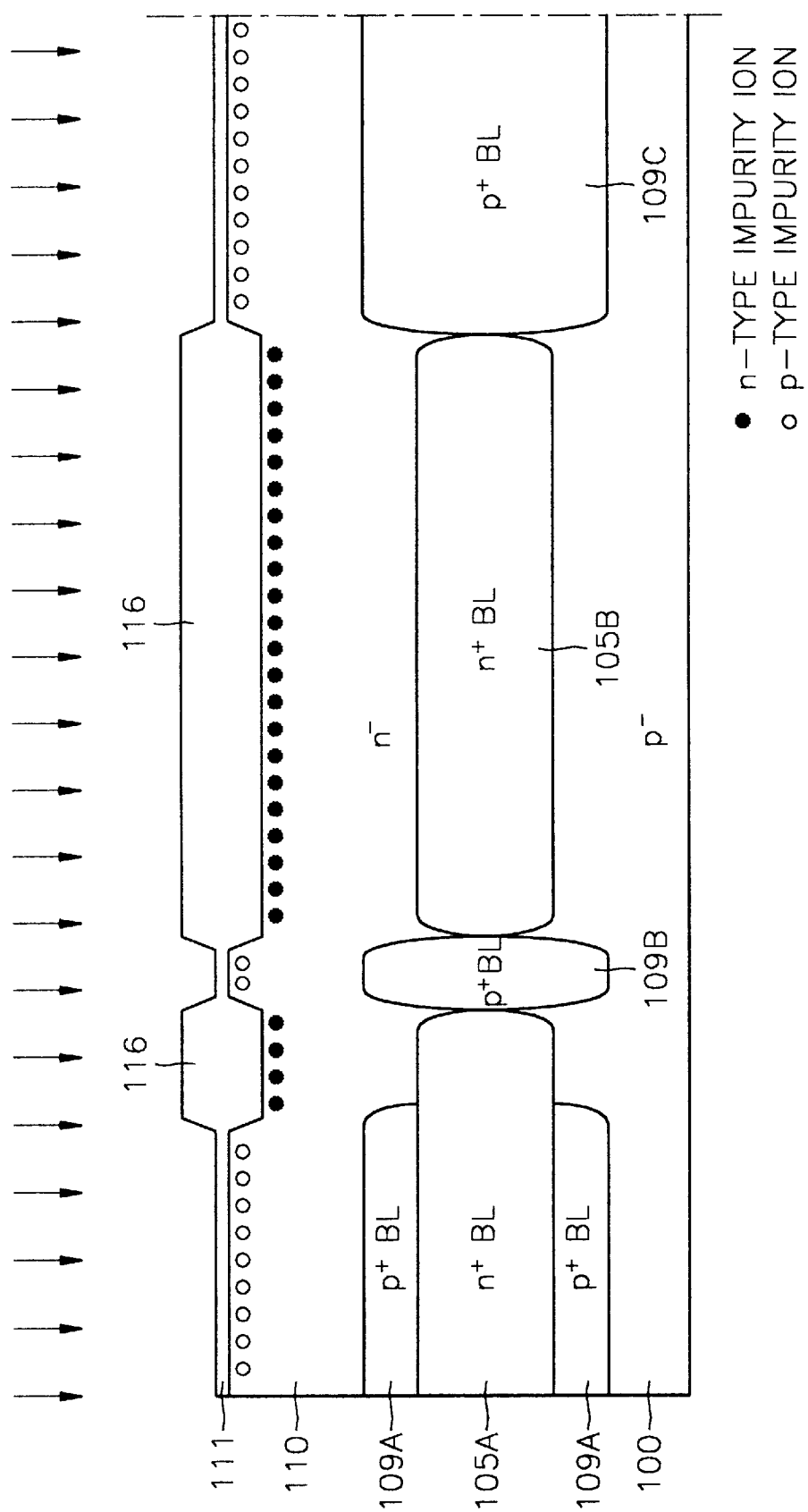

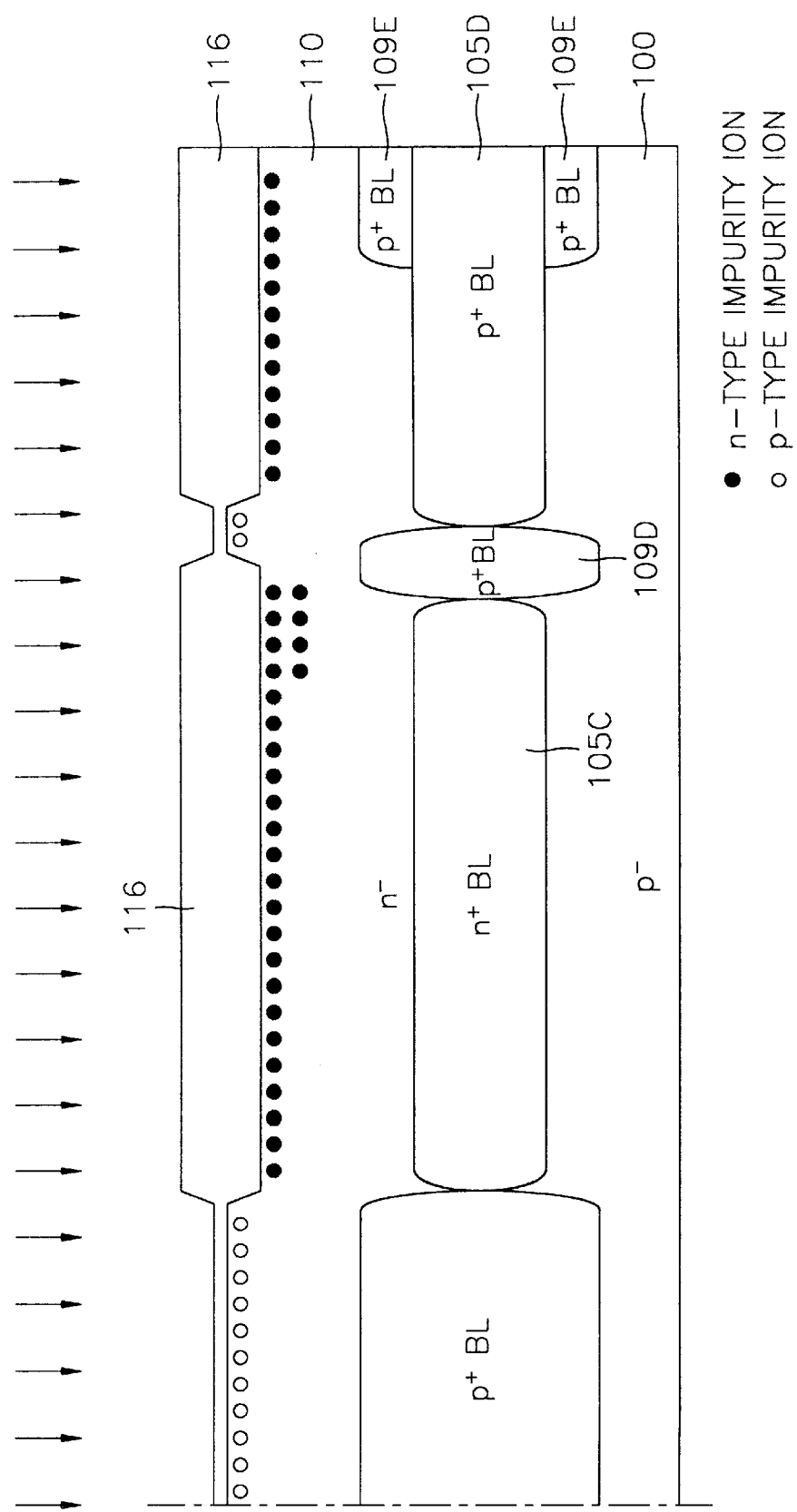

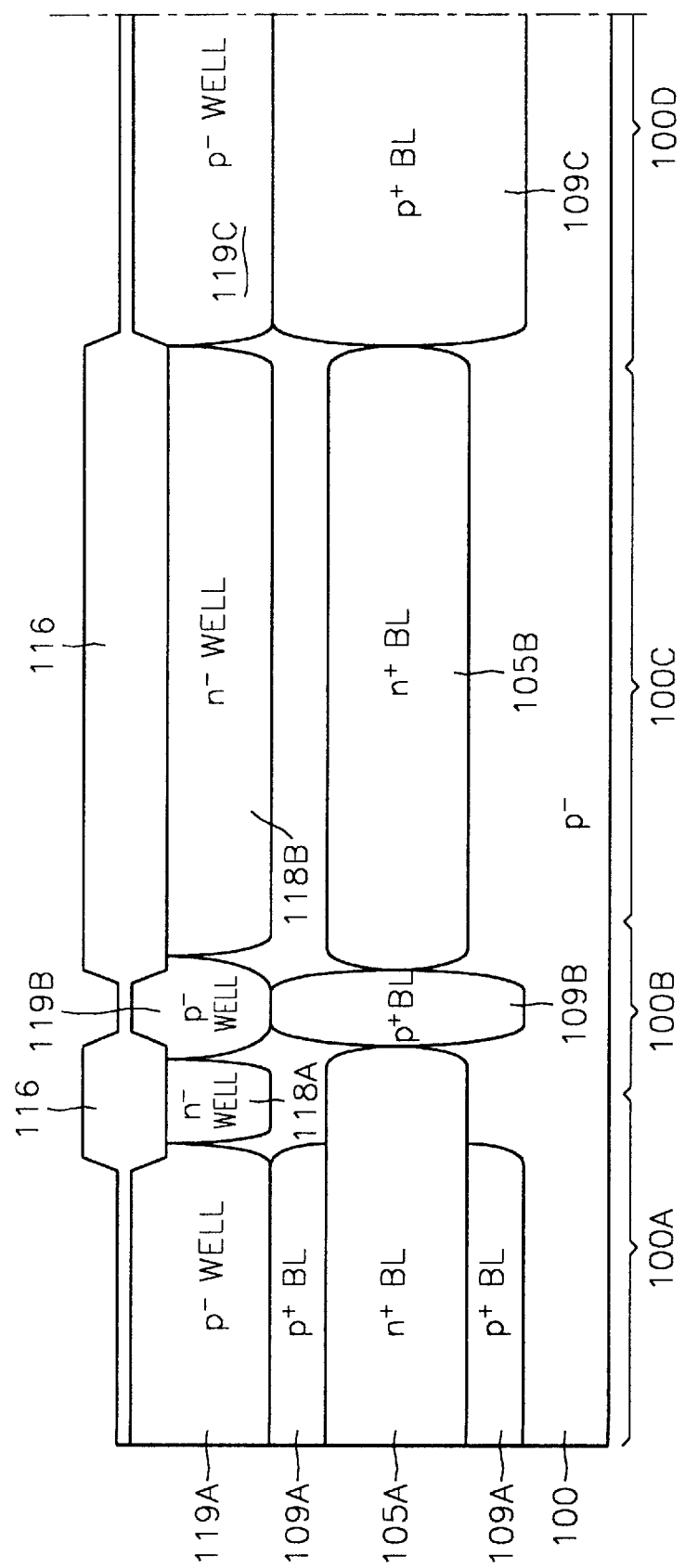

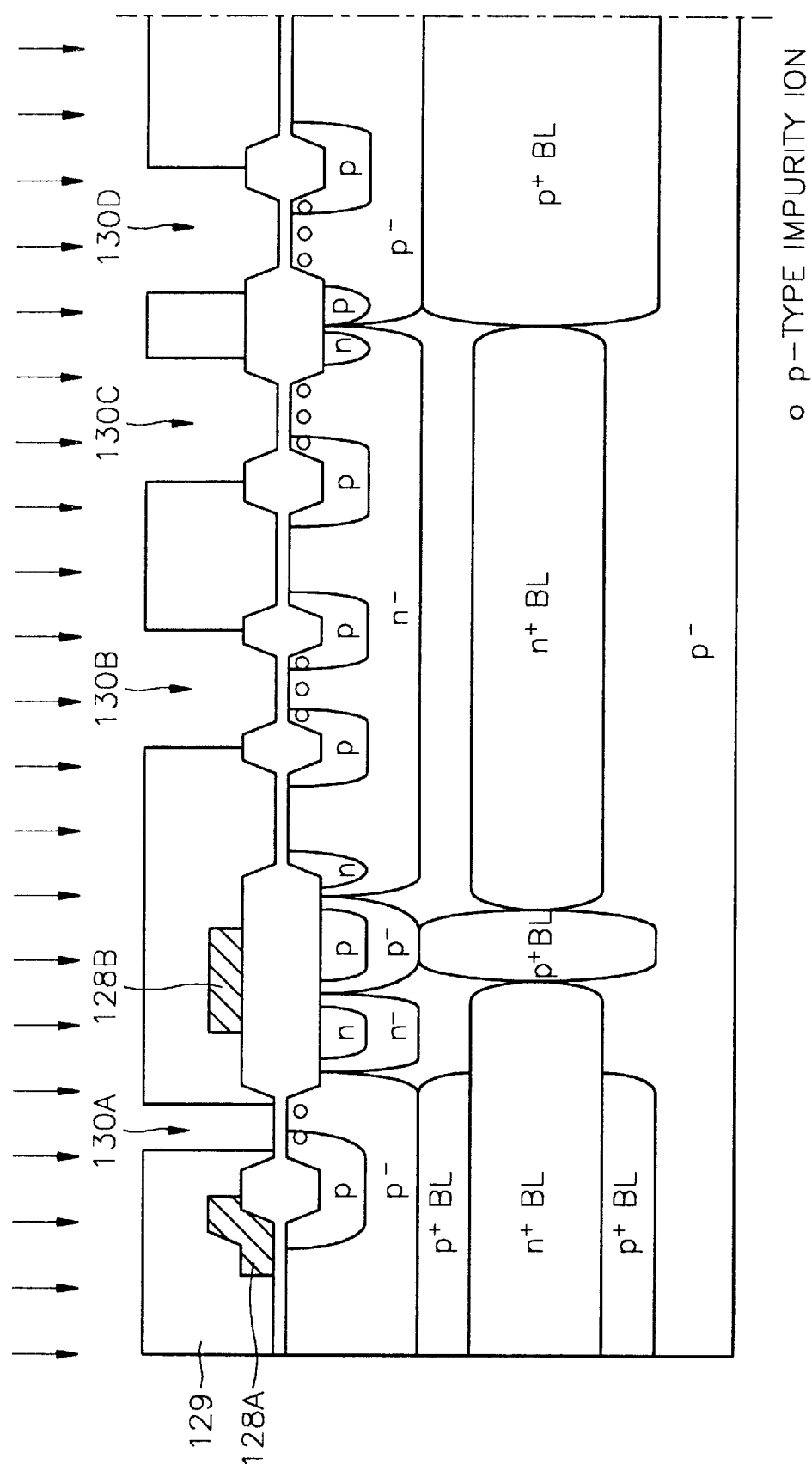

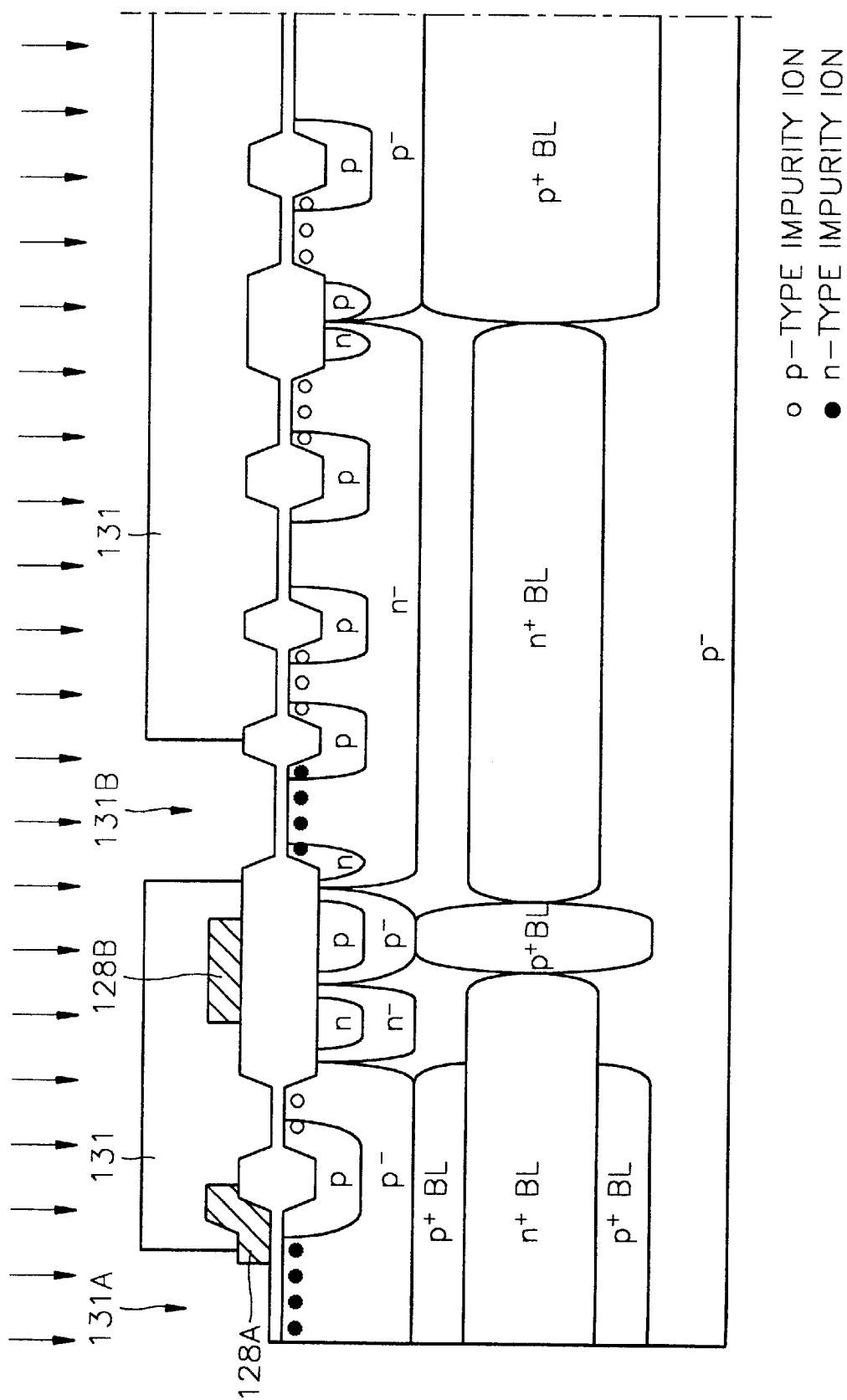

METHOD FOR FABRICATING BICDMOS DEVICE AND BICDMOS DEVICE FABRICATED BY THE SAME

CROSS REFERENCE TO RELATED APPLICATIONS

This application claims priority from Korean Priority Document No. 1998-41067, filed on Sep. 30, 1998 with the Korean Industrial Property Office, which document is hereby incorporated by reference.

BACKGROUND OF THE INVENTION

1. Field of the Invention

The present invention relates to a method for fabricating a semiconductor device and a semiconductor device fabricated by the method, and more particularly, to a method for fabricating a BiCDMOS device where a bipolar junction transistor, a complementary metal-oxide-semiconductor (CMOS) electric field effect transistor and a double diffused metal-oxide-semiconductor (DMOS) electric field effect transistor are formed on a single wafer, and to a BiCDMOS device fabricated by the method.

2. Description of the Related Art

BiCDMOS technology includes bipolar technology, CMOS technology and DMOS technology. That is, BiCDMOS technology can attain low power consumption, a small noise margin and a high integration density for CMOS technology, high switching speed and input and output speed for bipolar technology, and high power characteristics for DMOS technology. Thus, a power device and a logic device can be integrated onto a single chip, thereby reducing the chip size, reducing power consumption and withstanding high voltage and drive at high current. However, the technology of fabricating a BiCDMOS device is very complicated and requires many mask layers, thereby increasing manufacturing cost. Thus, a method for fabricating a BiCDMOS device reducing the number of required mask layers to lower the unit cost and increase performance of the device is required.

Meanwhile, a DMOS device included in the BiCDMOS device exhibit problems such as turn-on phenomenon of a parasitic transistor, and device failure due to excessive reverse-directional current.

FIG. 1 is a sectional view showing an example of a horizontal DMOS transistor included in a conventional BiCDMOS device, showing two cells in common using a source electrode.

Referring to FIG. 1, an n-type highly-doped buried layer 11 is formed on a semiconductor substrate 10 doped with p-type impurities, and an n-type lightly-doped epitaxial layer 12 is formed on the n$^+$-type buried layer 11. An n-type lightly-doped well region 13 is formed on the n-type epitaxial layer 12, and a p-type base region 14 is formed on the n-type well region 13. Also, n-type base regions 15a and 15b are formed at the sides of the p-type base region 14, spaced apart by a predetermined distance. N-type highly-doped source regions 16a and 16b are formed in the p-type base region 14. Meanwhile, n-type highly-doped drain regions 17a and 17b are formed on the n-type base regions 15a and 15b, respectively.

A source electrode 18 is formed to electrically contact the n-type source regions 16a and 16b and the p-type base region 14. Gate electrodes 19a and 19b are formed at the sides of the source electrode 18, spaced apart from the source electrode 18 by a predetermined distance. The gate electrodes 19a and 19b are formed on an oxide layer 20 at the sides of the n-type source regions 16a and 16b and over the p-type base region 14. Also, drain electrodes 21a and 21b electrically contact the n-type drain regions 17a and 17b. Meanwhile, the source electrode 18, the gate electrodes 19a and 19b and the drain electrodes 21a and 21b are insulated by an insulating layer 22.

In the horizontal DMOS transistor, a parasitic npn bipolar transistor composed of the n-type source regions 16a and 16b, the p-type base region 14 and the n-type drain regions 17a and 17b is turned on by voltage drop due to a current flowing through resistance $R_b$ of the p-type base region 14. Consequently, the gate electrodes 19a and 19b cannot be controlled, and as such, a device can be damaged. The current flowing through the resistance $R_b$ of the p-type base region 14 includes first zener diode current $I_{z1}$. Here, the first zener diode current $I_{z1}$ means current flowing through a first zener diode component 24a when overcurrent flows due to the inductance component of a load during the turn-off of a device to apply a voltage more than a predetermined voltage (zener voltage) between the p-type base region 14 and the drain regions 17a and 17b.

A deep p+ region 23 is formed deeply in the p-type base region 14. The deep p+ region 23 reduces resistance $R_b$ of the p-type base region 14. In addition, a second zener diode current $I_{z2}$ flowing through a second zener diode component 24b is formed between the deep p+ region 23 and the n-type buried layer 11, thereby reducing the amount of first zener diode current $I_{z1}$ that passes through the resistance $R_b$ of the p-type base region 14.

However, an additional mask layer is required for forming the deep p+ region 23, which complicates the fabrication process. Also, in a low pressure process, even though the concentration of the p+ region 23 is increased, the zener voltage of the first zener diode component 24a may be lower than the zener voltage of the second zener diode component 24b. Thus, even though the resistance $R_b$ of the p-type base region 14 is reduced, the first zener diode current $I_{z1}$ flows through the resistance $R_b$ pf the p-type base region 14, such that the parasitic npn bipolar transistor can be easily turned on. As a result, the reliability of the device can be deteriorated.

SUMMARY OF THE INVENTION

It is an objective of the present invention to provide a method for fabricating a BiCDMOS device capable of reducing the number of used mask layers to lower the cost and increase performance.

It is another objective of the present invention to provide a BiCDMOS device fabricated by the above method.

Accordingly, to achieve the first objective, in a method for fabricating a BiCDMOS device according to the present invention, a semiconductor region of a second conductivity type is formed on a semiconductor substrate of a first conductivity type. Well regions of the first conductivity type and well regions of the second conductivity type are formed in a selected region of the semiconductor region. An oxidation passivation layer pattern defining a region where a pad oxide layer and a field oxide layer are to be formed is formed on a surface of the substrate where the well regions are formed. Impurity ions of the first conductivity type are implanted into the entire surface of a region where a field oxide layer is to be formed, using the oxidation passivation layer pattern as an ion implantation mask. An ion implantation mask pattern defining a field region of the second conductivity type is formed on a substrate where the oxidation passivation layer pattern is formed. Impurity ions of the second conductivity type are implanted using the ion implantation mask pattern. The ion implantation mask pattern is removed. A field oxide layer is formed by annealing with respect to the substrate where the oxidation passivation layer pattern is formed. And at the same time, a field region of the first conductivity type and a field region of the second conductivity type are formed.

Preferably, the method further comprises the step of forming buried layers of the first conductivity type and the second conductivity type in the selected region of the semiconductor substrate, before step of forming the well regions of first and second conductivity types. Here, the step of forming the buried layers of the first and the second conductivity types comprises the substeps of: forming buried layers of the second conductivity type in the predetermined region of the semiconductor substrate; implanting impurities of the first conductivity type into a region except the region where the buried layers of the second conductivity type are formed, and into part of a region of the buried layers of the second conductivity type formed in region corresponding to a region where the double diffused MOS transistor is to be formed; and diffusing impurities of the first conductivity type to form buried layers of the first conductivity type, where the buried layer of the first conductivity type formed in the region corresponding to the region where the double diffused MOS transistor is downward from a bottom surface of the buried layer of the second conductivity type.

Also, the method further comprises the steps of: forming a gate conductive layer of a double diffused MOS transistor after forming the field oxide layer; forming body regions of the first conductivity type and the second conductivity type; forming gate conductive layers of a high voltage MOS transistor and a complementary MOS transistor; forming a base region of a bipolar transistor; forming source and drain regions of the double diffused MOS transistor, the high voltage MOS transistor and the complementary MOS transistor and an emitter region and a collector region of the bipolar transistor; and forming source and drain electrodes of the double diffused MOS transistor, the high voltage MOS transistor and the complementary MOS transistor, and a base electrode, an emitter electrode and a collector electrode of the bipolar transistor.

To achieve the second objective, according to a BiCDMOS device of the present invention, a highly-doped buried layer of a second conductivity type is formed on a semiconductor substrate of a first conductivity type, and a lightly-doped semiconductor region of the second conductivity type is formed on the buried layer. A lightly-doped well region of the second conductivity type is formed on the semiconductor region, and body regions of first and second conductivity types are formed in a predetermined region of the well region. A highly-doped wing-shaped buried layer of the second conductivity type is formed in the lower and upper portions of the buried layer of the second conductivity type, to thereby form a diode together with the buried layer of the second conductivity type. Also, a highly-doped source region of the second conductivity type is formed in the body region of the first conductivity type, and a highly-doped drain region of the second conductivity type is formed in the body region of the second conductivity type. A gate electrode is formed on the source region and a predetermined region of the body region of the first conductivity type, a source electrode is formed to partially contact the source region, and a drain electrode is formed to contact the drain region.

The BiCDMOS device of the invention further comprises a field region of the second conductivity type formed in a well region between the body regions of the first and the second conductivity types of the DMOS transistor, and the concentration of the impurity in the field region is higher than that in the well region.

According to the present invention, the number of mask layers used for fabricating a BiCDMOS device is reduced. Also, in a horizontal DMOS transistor of the BiCDMOS device, a p-type upper buried layer overlaps with the lower portion of the body region, so that most of the zener diode current flows through the overlapping region. Thus, the amount of the zener diode current flowing through the lower end of the source region is reduced, so that the turning-on of a parasitic bipolar transistor is suppressed.

BRIEF DESCRIPTION OF THE DRAWINGS

The above objectives and advantages of the present invention will become more apparent by describing in detail a preferred embodiment thereof with reference to the attached drawings, in which:

FIGS. 2A through 24B are sectional views illustrating a method for fabricating a BiCDMOS device according to the present invention.

DESCRIPTION OF THE PREFERRED EMBODIMENTS

Figure 1:
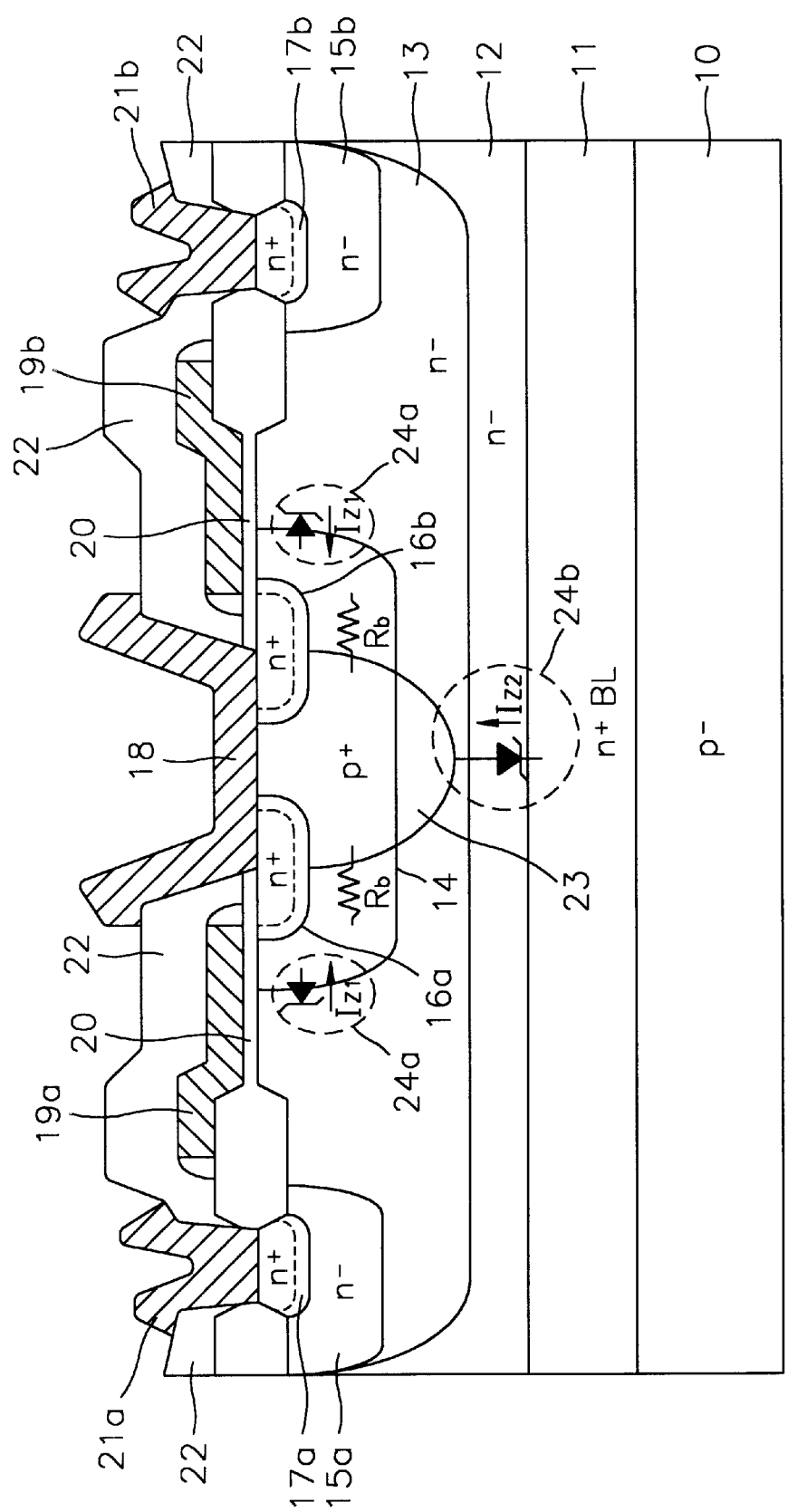
FIG. 1 is a sectional view of a DMOS electric field effect transistor included in a conventional BiCDMOS device.

Here, each of the devices forming a BiCDMOS device can be a complementary type, and for convenience, an n-type or a p-type device is denoted in the drawings.

FIGS. 2A through 6B are sectional views for illustrating a step of forming n-type buried layers and p-type buried layers.

Referring to FIGS. 2A and 2B, a semiconductor substrate 100 having a p-type conductivity type is provided. The semiconductor substrate 100 includes a region 100A where a lateral double diffused p-type MOS (LDPMOS) transistor is to be formed, a region 100B where a resistor is to be formed, a region 100C where a high voltage p-type MOS transistor is to be formed, a region 100D where an n-type MOS transistor is to be formed, a region 100E where an npn bipolar transistor is to be formed, a region 100F where a capacitor is to be formed, and a region 100G where a lateral double diffused n-type MOS (LDNMOS) transistor is to be formed, respectively, thereby forming the BiCDMOS device.

Then, a first oxide layer pattern 101 and a photoresist layer pattern 102 are formed on the semiconductor substrate 100. For this, a first photoresist layer and a photoresist layer are sequentially formed on the semiconductor substrate 100. The photoresist layer pattern 102 is formed by exposure and development according to a typical photolithographic method. The photoresist layer pattern 102 is used as an n-type impurity ion implantation mask for forming an n-type buried layer. Then, the first oxide layer pattern 101 is formed using the photoresist layer pattern 102 as an etching mask. Thus, a region where the n-type buried layer is to be formed is exposed by the first oxide layer pattern 101 and the photoresist layer pattern 102. That is, the first oxide layer pattern 101 and the photoresist layer pattern 102 include an opening 103A for forming an n-type buried layer of the LDPMOS transistor, an opening 103B for forming an n-type buried layer of a high voltage PMOS transistor, an opening 103C for forming an n-type buried layer of an npn bipolar transistor and an opening 103D for forming an n-type buried layer of an LDNMOS transistor.

Referring to FIGS. 3A and 3B, n-type impurity ions for forming an n-type buried layer are implanted, using the photoresist layer pattern 102 and the first oxide layer pattern 101 as an ion implantation mask. Here, arsenic (As) ions can be used as the n-type impurity ions, such that the concentration of the ion implantation becomes $3 \times 10^{15} \sim 5 \times 10^{15}$ atoms/cm². The photoresist layer pattern 102 is completely removed after implantation of the n-type impurity ions, and a drive-in diffusion process is performed with respect to the implanted n-type impurity ions. The diffusion process is performed by annealing at 1200° C. for 200~400 minutes. Thus, n-type buried layers 105A, 105B, 105C and 105D are formed in a region of the substrate 100 corresponding to the LDPMOS transistor region 100A, the high voltage PMOS transistor region 100C, the npn bipolar transistor region 100E and the LDNMOS transistor region 100G, respectively. Oxygen (O₂) gas is injected into a reaction chamber for performing the diffusion process so as to form a second oxide layer 104 on the exposed surfaces 103A, 103B, 103C and 103D of the semiconductor substrate 100. Here, a step coverage is formed on a surface of the semiconductor substrate 100 due to the difference in growth rates between the first oxide layer pattern 101 and the second oxide layer 104. The step is used as an alignment key in the next process after removing the first oxide layer pattern 101 and the second oxide layer 104.

Figure 4A:
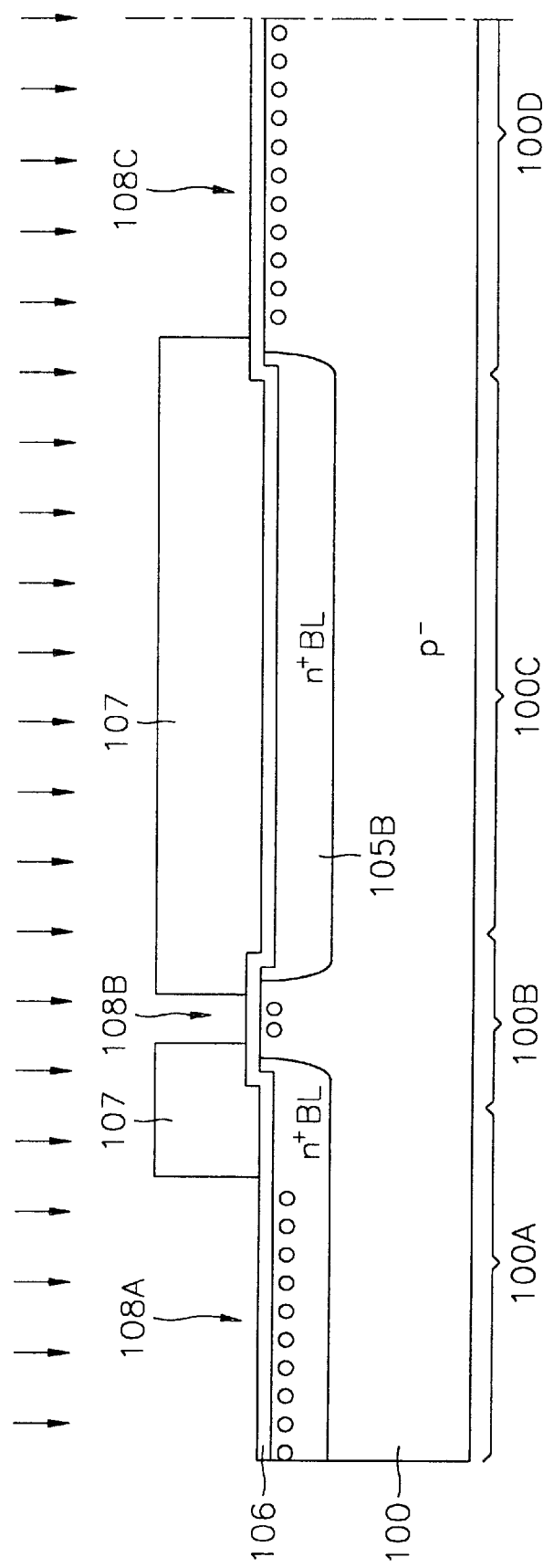

Referring to FIGS. 4A and 4B, the first oxide layer pattern 101 and the second oxide layer 104 are removed. Also, a third oxide layer 106 is grown in the exposed surface of the substrate 100. The third oxide layer 106 is used as an ion implantation buffer layer, and has a thickness of approximately 800 Å. Then, a photoresist layer is coated on the third oxide layer 106, and a photoresist layer pattern 107 is formed, using a typical photolithographic method. At this time, the alignment is performed using the steps formed in the former process. The photoresist layer pattern 107 is used as an impurity ion implantation mask for forming a p-type buried layer. Thus, the photoresist layer pattern 107 includes an opening 108A that exposes a region where a p-type buried layer of an LDPMOS transistor is to be formed, an opening 108B that exposes a region where a resistor is to be formed, an opening 108C that exposes a region where an NMOS transistor is to be formed, an opening 108D that exposes a region where a capacitor is to be formed, and an opening 108E that exposes a region where a p-type buried layer of an LDNMOS transistor is to be formed.

Then, p-type impurity ions are implanted, using the photoresist layer pattern 107 as an ion implantation mask, and the third oxide layer 106 as an ion implantation buffer layer. Boron (B) can be used as a p-type impurity ion, and the concentration of the ion implantation becomes $1 \times 10^{14} \sim 3 \times 10^{14}$ atoms/cm².

Referring to FIGS. 5A and 5B, the photoresist layer pattern 107 is removed, and the p-type impurity ion drive-in diffusion process is performed. That is, the implanted p-type impurity ions are diffused by annealing at 1200° C. for 100~300 minutes. Thus, p-type buried layers 109A and 109E are formed under n-type buried layers 105A and 105D of the LDPMOS transistor region 100A and the LDNMOS transistor region 100G, respectively, and p-type buried layers 109B, 109C and 109D are formed in a region of the substrate 100 corresponding to the resistance region 100B, the NMOS transistor region 100D and the capacitor region 100F, respectively.

Figure 6A:
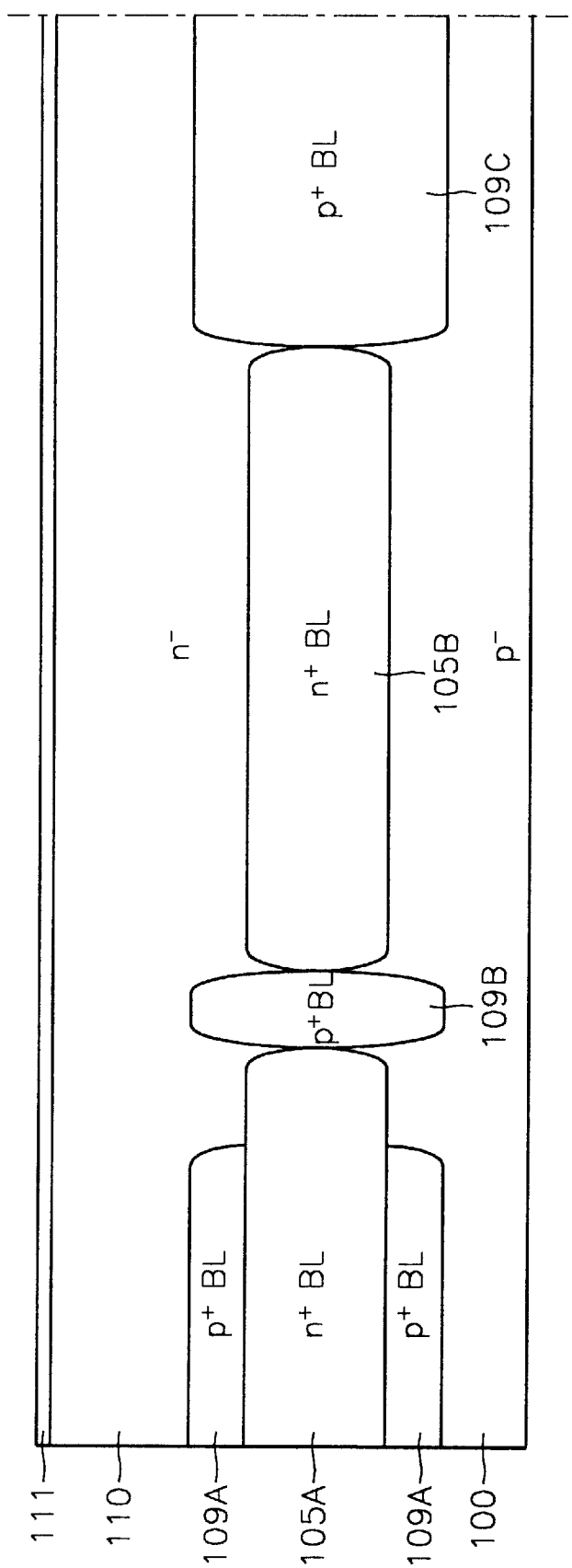
Figure 6B:
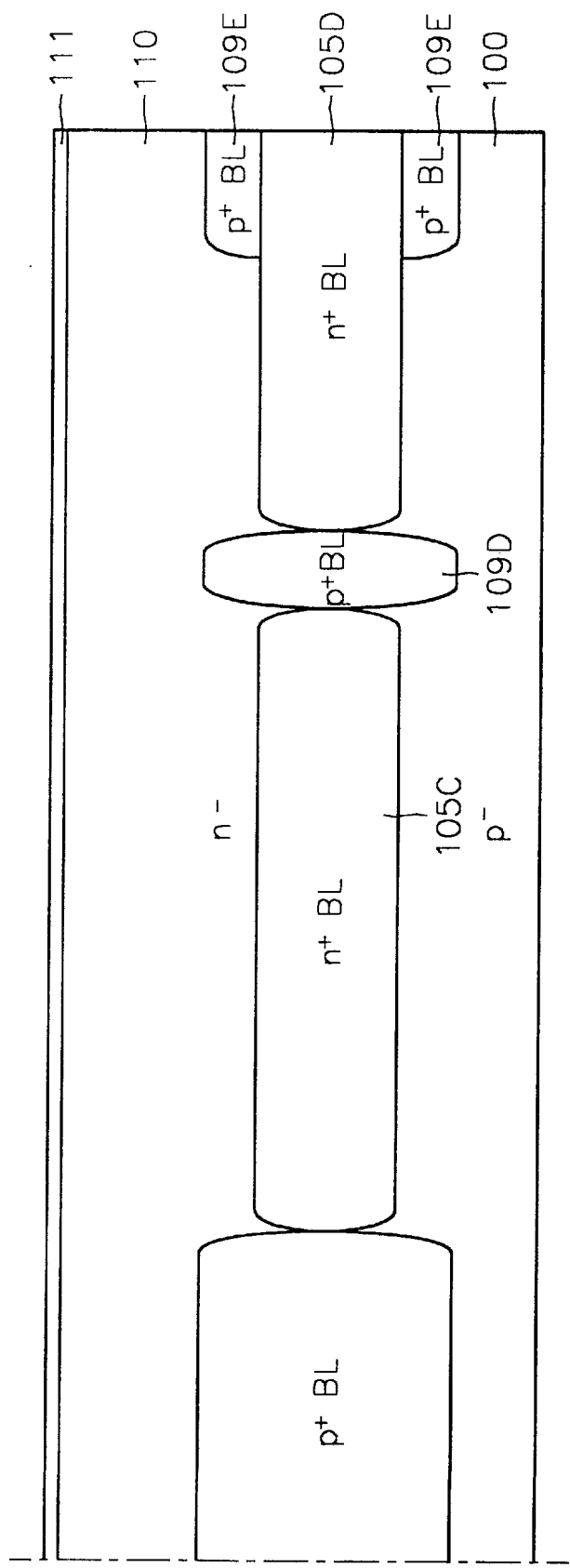

Referring to FIGS. 6A and 6B, lightly-doped n-type epitaxial layer 110 is grown after completely removing the third oxide layer 106. The thickness of the n-type epitaxial layer 110 is 5~7 μm, and resistivity is 1.4~2.0 U. At this time, n-type buried layers 105A through 105D and p-type buried layers 109A through 109E extend during annealing for growing the fourth oxide layer 111. That is, the n-type buried layers extend vertically from a boundary surface between the substrate 100 and the n-type epitaxial layer 110. Also, the p-type buried layers extend vertically to a boundary surface between the substrate 100 and the n-type epitaxial layer 110.

The p-type buried layer 109A of the LDPMOS transistor and the p-type buried layer 109E of the LDNMOS transistor concurrently extend with the growth of the epitaxial layer 110 to be formed on the upper and lower surfaces of the n-type buried layers 105A and 105D. In detail, the diffusion speed of boron, the p-type impurity ion, is faster than that of arsenic, which is the n-type impurity ion. Thus, the p-type impurity ions cross the highly-doped n-type region to be diffused to the upper portion of the n-type buried layers 105A and 105D during the growth of the n-type epitaxial layer 110. Also, the openings 108A through 108E for implanting the p-type impurity ions are sufficiently smaller than the openings 103A through 103D for implanting the n-type impurity ions, so that the implanted p-type impurity ions are diffused in the lateral direction without extending past the n-type buried layers 105A and 105D. Thus, the two p-type buried layers 109A and 109E are formed on the upper and lower surfaces of the n-type buried layers 105A and 105D, respectively.

FIGS. 7A through 10B are sectional views illustrating the step of forming a sink region and each of the well regions.

Figure 7A:
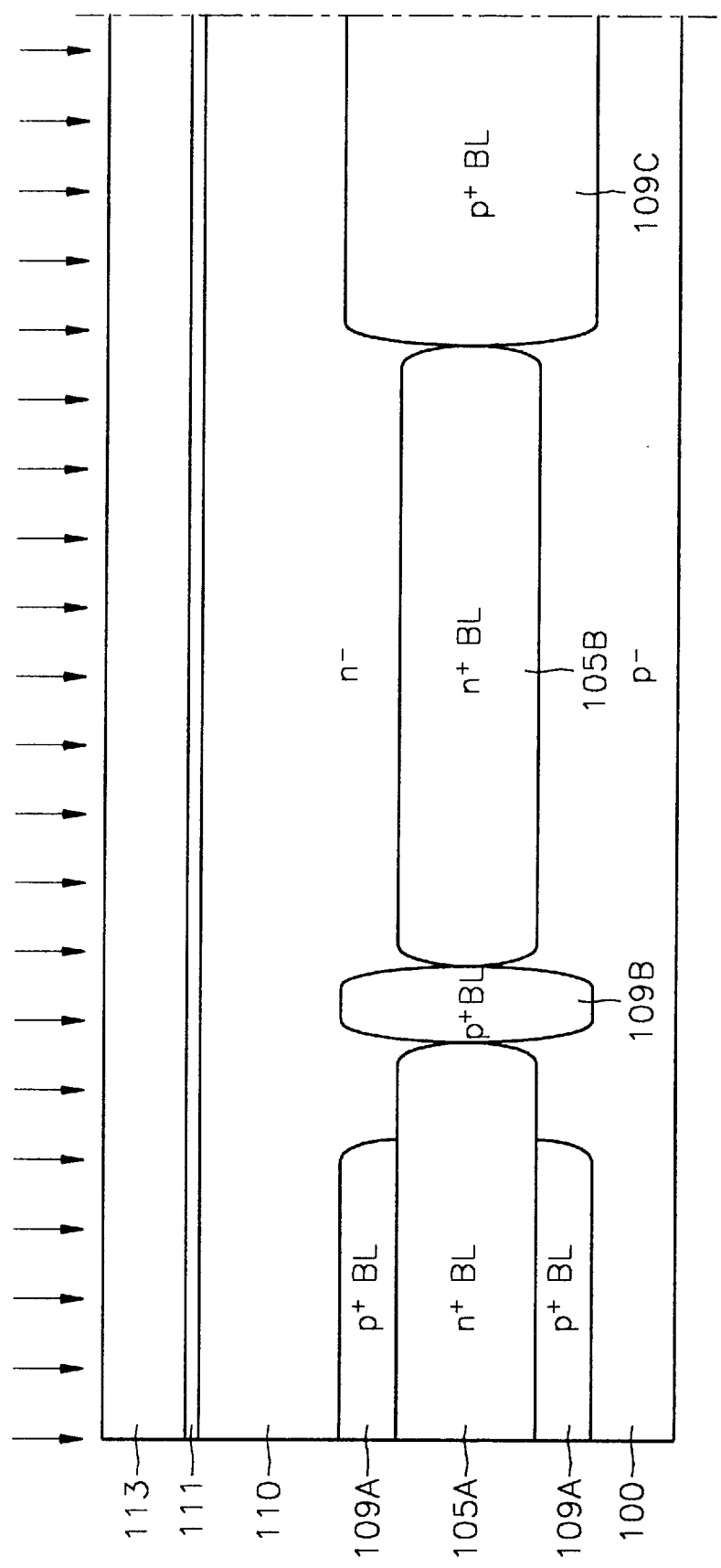

Referring to FIGS. 7A and 7B, a photoresist layer is coated on the fourth oxide layer 111. A photoresist layer pattern 113 having an opening 112 exposes a portion where a n-type highly-doped sink region is to be formed, using a typical photolithographic method. The photoresist layer pattern 113 is used as an ion implantation mask for forming the n-type highly-doped sink region. That is, n-type impurity ions are implanted on the entire surface using the photoresist layer pattern 113 as an ion implantation mask. Preferably, phosphor is used as the n-type impurity ion, and the ion implantation concentration is $4 \times 10^{15} \sim 7 \times 10^{15}$ atoms/cm².

Figure 8B:
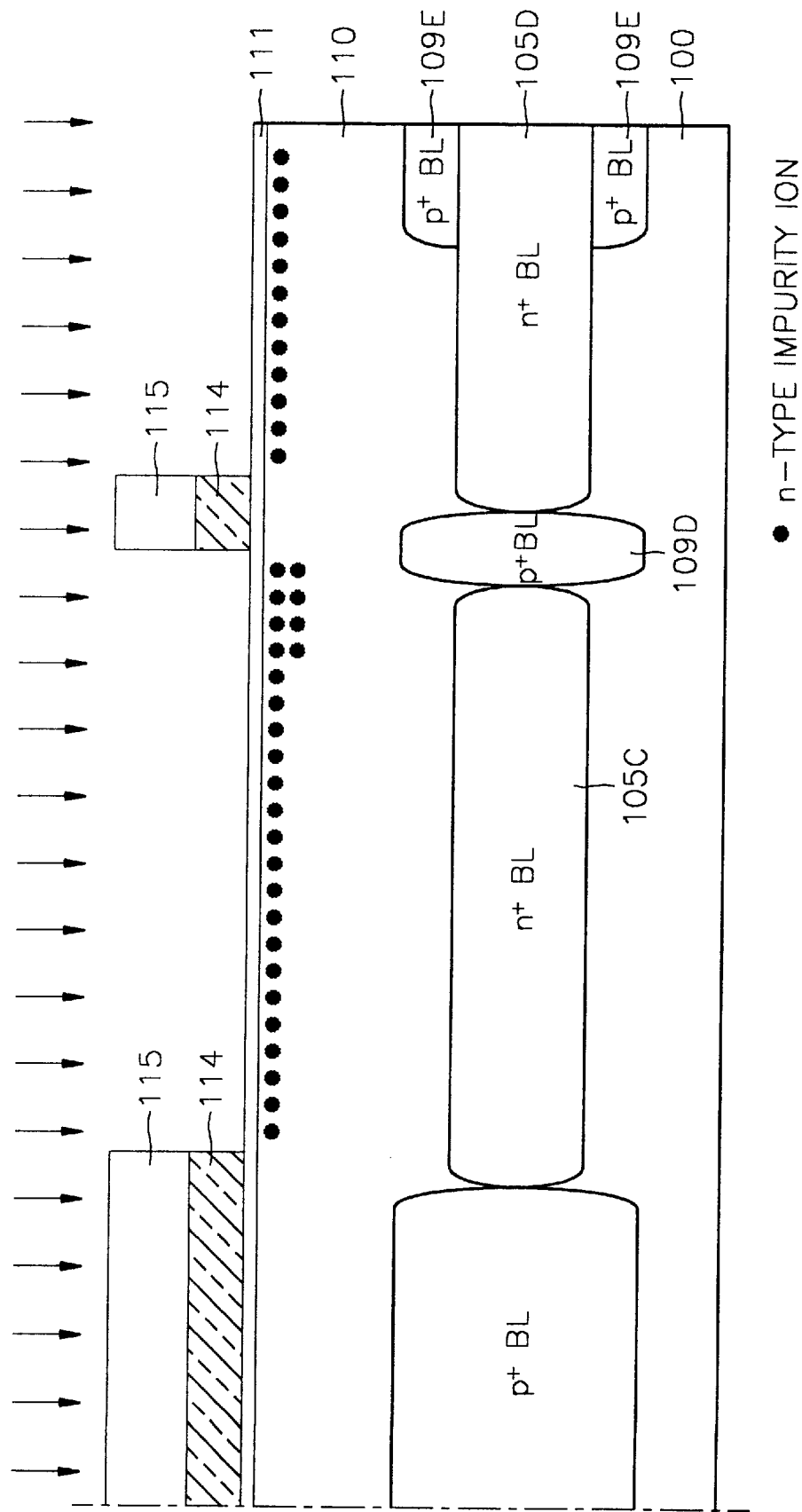

Referring to FIGS. 8A and 8B, a nitride layer and a photoresist layer are sequentially coated, after completely removing the photoresist layer pattern 113. A photoresist layer pattern 115 is formed, using a typical photolithographic method. Photoresist layer pattern 115 is used as an ion implantation mask for forming an n-type well region. Then, the nitride layer is etched, using the photoresist layer pattern 115 as an etching mask to form a nitride layer pattern 114. Then, portions where an n-type well region is to be formed are exposed by the nitride layer pattern 114 and the photoresist layer pattern 115. N-type impurity ions for forming an n-type well region, i.e., phosphor (P) are implanted, using the photoresist layer pattern 115 as an ion implantation mask. Here, preferably, the implantation concentration of n-type impurity ions is $3 \times 10^{12} \sim 4 \times 10^{12}$ atoms/cm².

Referring to FIGS. 9A and 9B, the photoresist layer pattern is completely removed. A field oxide layer 116 is formed using the nitride layer pattern 114 as a passivation layer. The field oxide layer 116 is formed by a typical local oxidation of silicon (LOCOS). The nitride layer pattern 114 is removed after forming the field oxide layer 116. P-type impurity ions for forming a p-type well region, e.g., boron, are implanted using the field oxide layer 116 as an ion implantation mask. Here, preferably, the implantation concentration of p-type impurities is $9 \times 10^{12} \sim 10 \times 10^{12}$ atoms/cm$^2$.

Figure 10B:
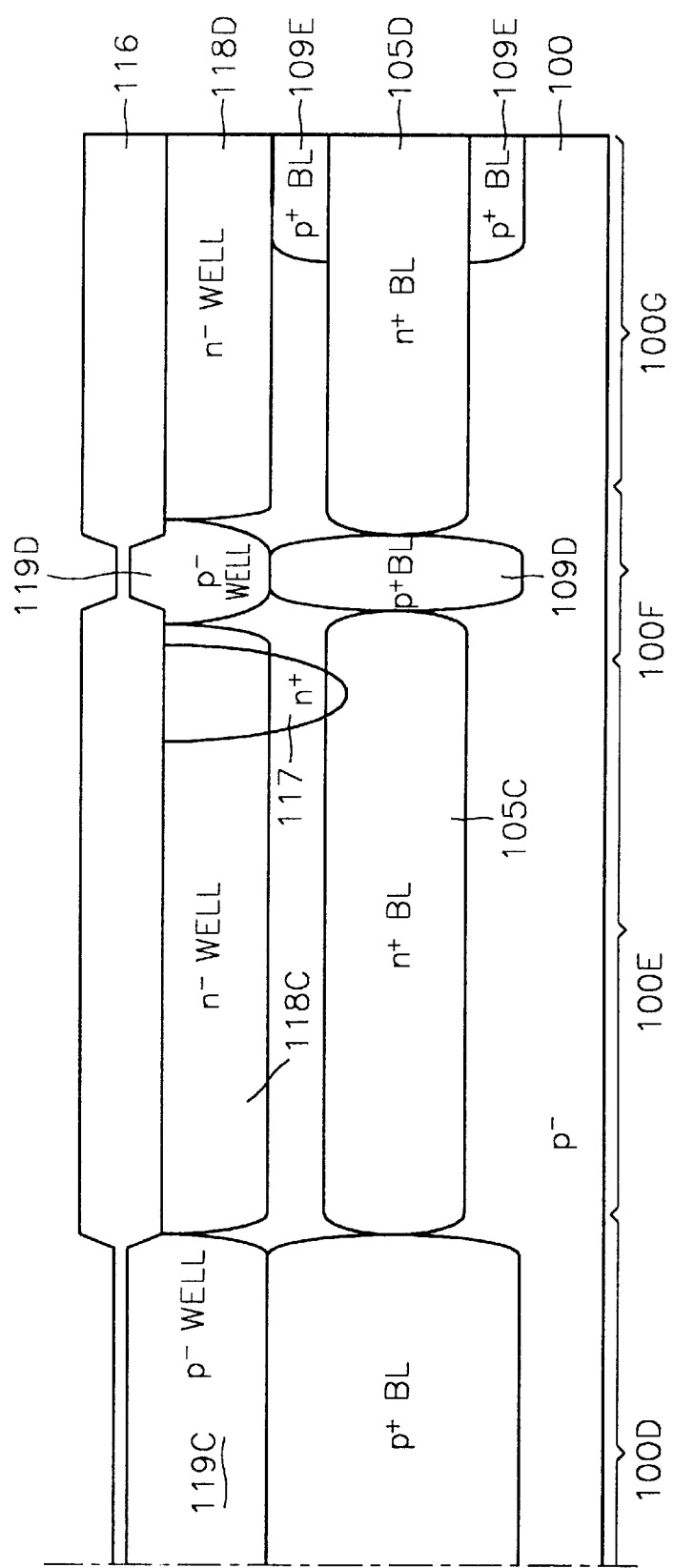

Referring to FIGS. 10A and 10B, n-type impurity ions for forming an n-type highly-doped sink region 117, n-type impurity ions for forming n-type well regions 118A through 118D, and p-type impurity ions for forming p-type well regions 119A through 119D are diffused by the drive-in diffusion process at a high temperature for a predetermined time. Preferably, the diffusion process is performed at 1150° C. for 300~500 minutes. When the diffusion process is performed, the p-type well region 119A is formed in the LDPMOS transistor region 100A to contact the upper portion of the p-type buried layer 109A, the p-type well region 119B is formed in the resistance region 100B to contact the upper portion of the p-type buried layer 109B, the p-type well region 119C is formed in the NMOS transistor region 100D to contact the upper portion of the p-type buried layer 109C, and the p-type well region is formed in the capacitor region 100F to contact the upper portion of the p-type buried layer 109D. The n-type well region 118D is partially formed in the LDNMOS transistor region 100G to contact the p-type buried layer 109E. The n-type well region 118B is formed in the high voltage PMOS transistor region 100C, spaced apart from the upper portion of the n-type buried layer 105B by a predetermined distance, and the n-type well region 118C is formed in the npn bipolar transistor region 100E, spaced apart from the upper portion of the n-type buried layer 105C by a predetermined distance. Also, the n-type well region 118A is formed in a device isolation region between the LDPMOS transistor region 100A and the region 100B where the resistance is to be formed, spaced apart from the n-type buried layer 105A by a predetermined distance.

FIGS. 11A through 15B are sectional views illustrating the step of forming a field region for isolation, a field oxide layer and a gate conductive layer of a DMOS transistor and implanting an impurity ion for forming a body region.

Figure 11A:
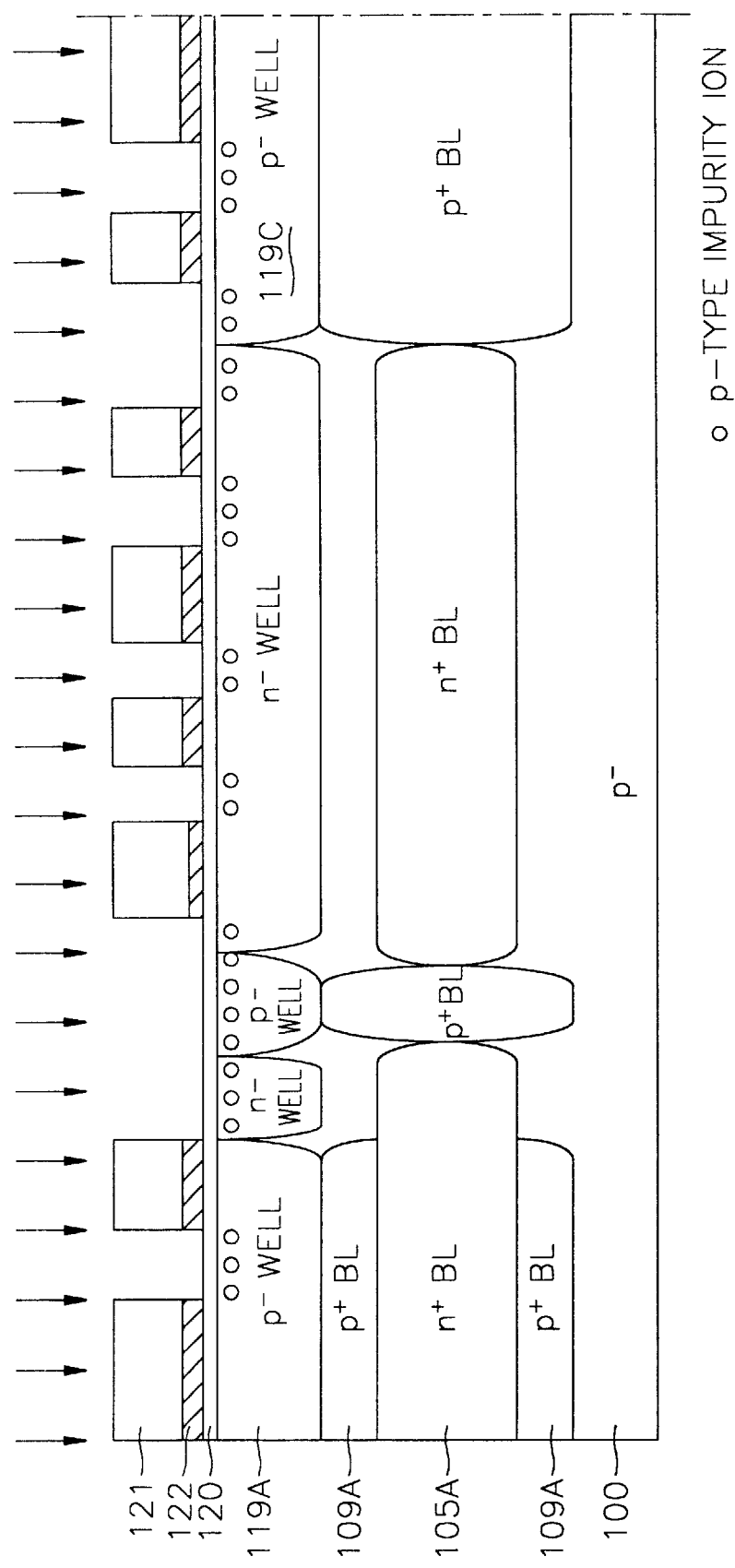
Figure 11B:
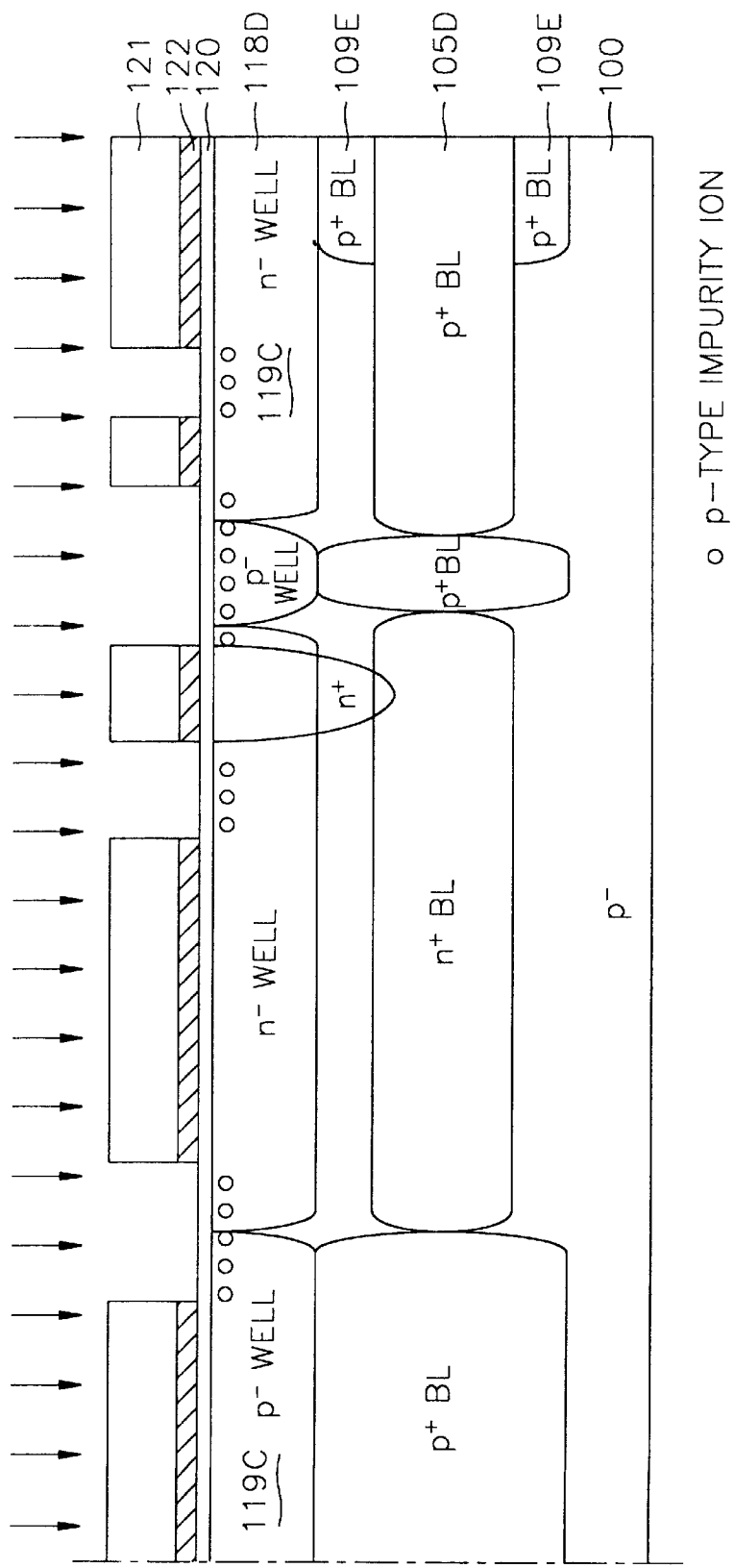

Referring to FIGS. 11A and 11B, all oxide layers including the field oxide layer 116 on the surface of the substrate 100 are removed. Also, a pad oxide layer 120 is grown. The thickness of the pad oxide layer 120 is 700~800 Å. An oxide passivation layer, e.g., a nitride layer is formed on the pad oxide layer 120, after forming the pad oxide layer 120, and a photoresist layer is coated on the resultant structure. A photoresist layer pattern 121 is formed by exposure and development using a typical photolithographic method. Then, the nitride layer is etched using the photoresist layer pattern 121 as a mask to form an oxidation passivation layer pattern 122. The oxidation passivation layer pattern 122 is for defining the active region of each device, and forming field oxide layers separating the active regions. Thus, the photoresist layer pattern 121 and the oxidation passivation layer pattern 122 expose a region where a field oxide layer is to be formed. Subsequently, the p-type impurity ions are implanted using the photoresist layer pattern 121 that was used for forming the oxidation passivation layer pattern 122 so that it is not necessary to use an additional ion implantation mask for forming a p-type field region. Preferably, the p-type impurity ion is boron, and the ion implantation concentration is $3 \times 10^{13} \sim 5 \times 10^{13}$ atoms/cm$^2$.

Figure 12A:
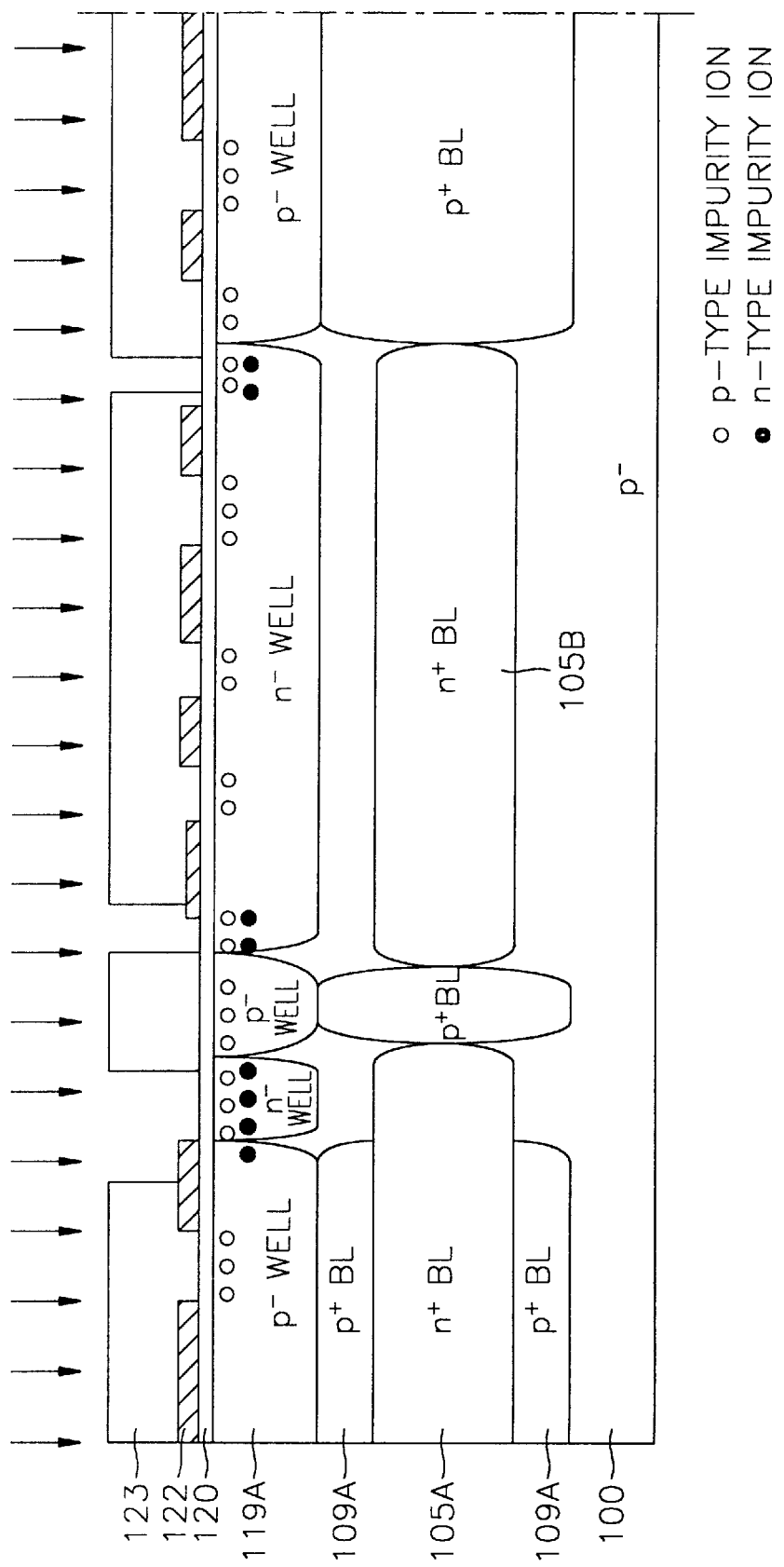
Figure 12B:
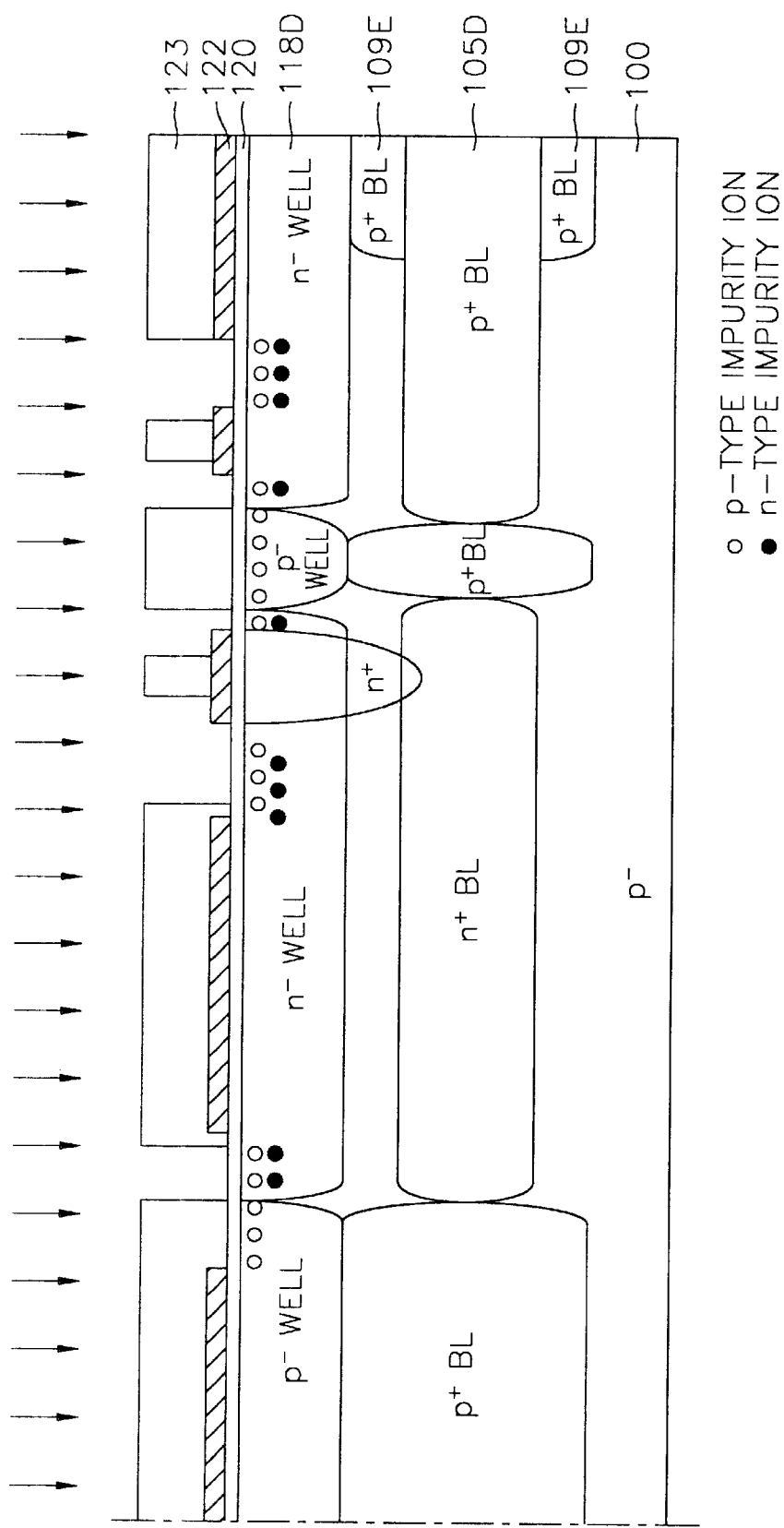

Referring to FIGS. 12A and 12B, the photoresist layer pattern 121 is completely removed to partially expose the oxidation passivation layer pattern 122 and the pad oxide layer 120. An ion implantation mask pattern 123 defining an n-type field region is formed on exposed surfaces of the oxidation passivation layer pattern 122 and the pad oxide layer 120. Preferably, the ion implantation mask pattern 123 is formed of a photoresist layer pattern. N-type impurity ions are implanted using the ion implantation mask pattern 123 as a mask. Preferably, phosphor can be used as the n-type impurity ion, and the ion implantation concentration is $1 \times 10^{13} \sim 3 \times 10^{13}$ atoms/cm$^2$.

As described above, p-type impurity ions for forming the p-type field region are implanted using the photoresist layer pattern 121 that was used for forming the oxidation passivation layer pattern 122, which is a mask for forming a field oxide layer, so that a p-type field ion implantation mask is not additionally required, thereby reducing the number of the mask layers.

Figure 13A:
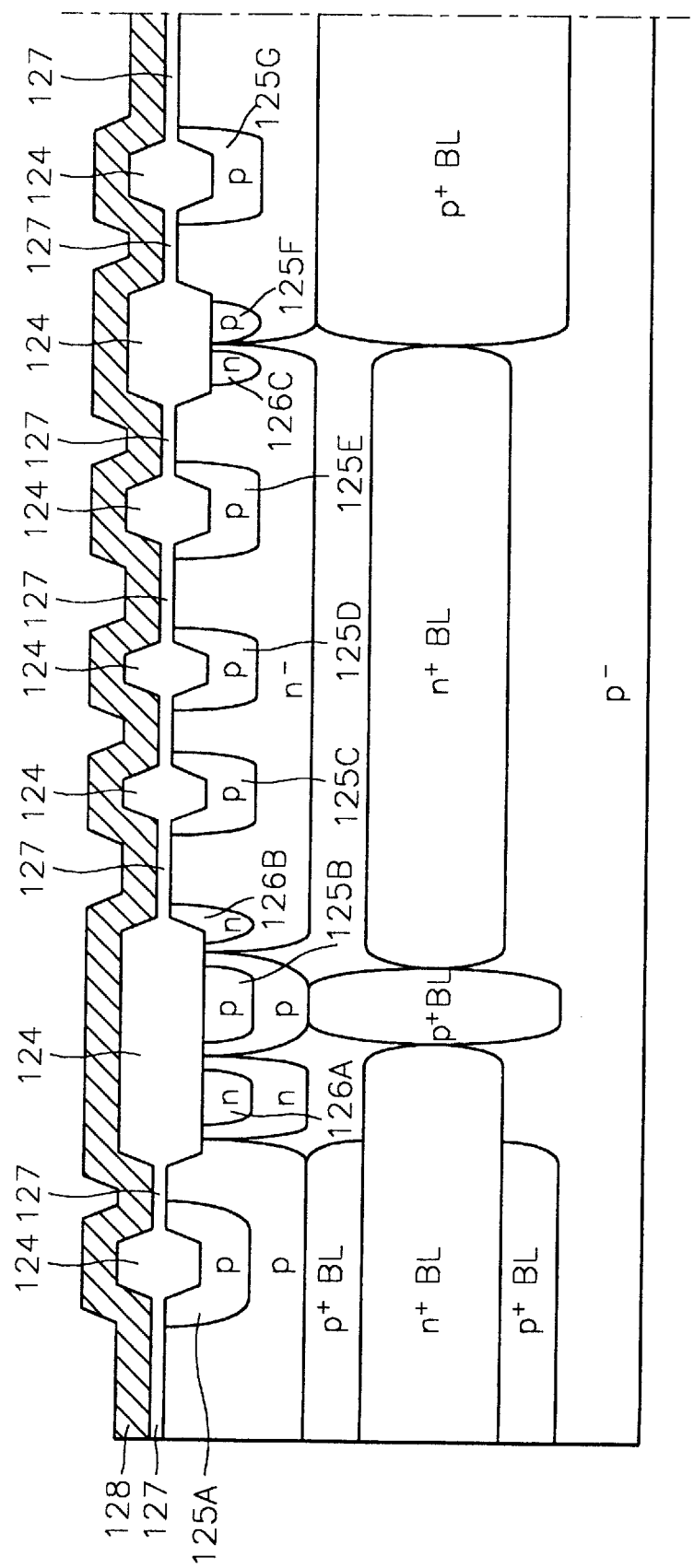
Figure 13B:
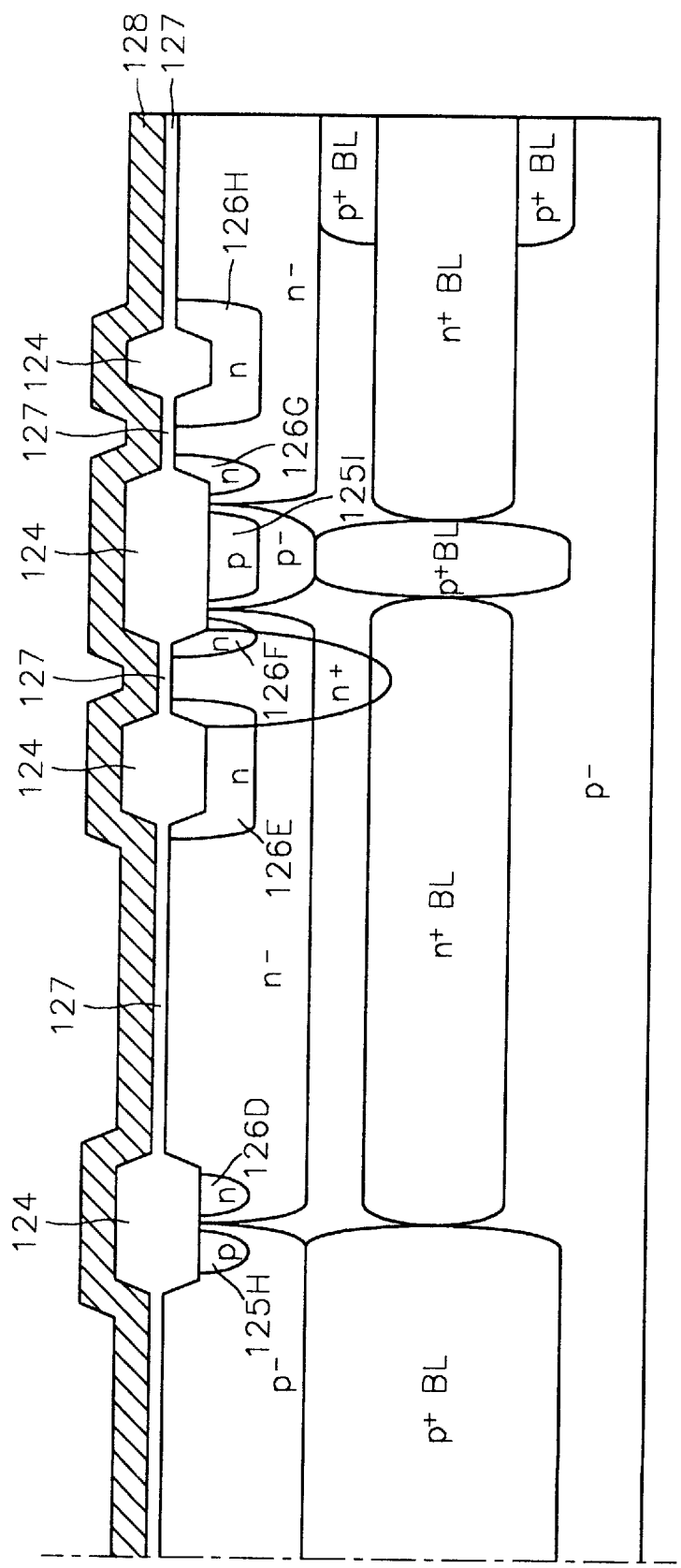

Referring to FIGS. 13A and 13B, the photoresist layer pattern 123 is completely removed. A field oxide layer 124 is formed using a typical LOCOS process. Here, implanted p-type and n-type impurity ions are diffused to form p-type field regions 125A through 125I and n-type field regions 126A through 126H during the growth of the field oxide layer 124. The pad oxide layer 120 is removed after forming the field oxide layer 124. Also, a sacrificial oxide layer (not shown) is removed to remove defects of an exposed interface surface. A fifth oxide layer 127 is formed on an exposed surface of the substrate. Here, preferably, the fifth oxide layer 127 is grown at 850~950° C. Part of the fifth oxide layer 127 is used as the LDPMOS transistor and a gate oxide layer of the LDNMOS transistor. After the field oxide layer 124 and the fifth oxide layer 127 are formed, a polysilicon layer 128 is deposited on the entire surface of the resultant structure. Preferably, the thickness of the polysilicon layer 128 is 3000 Å. Impurity ions are implanted to have a predetermined conductivity after depositing the polysilicon layer 128. Here, arsenic can be used as the impurity ion, and the concentration is $5 \times 10^{15} \sim 8 \times 10^{15}$ atoms/cm$^2$.

Figure 14B:
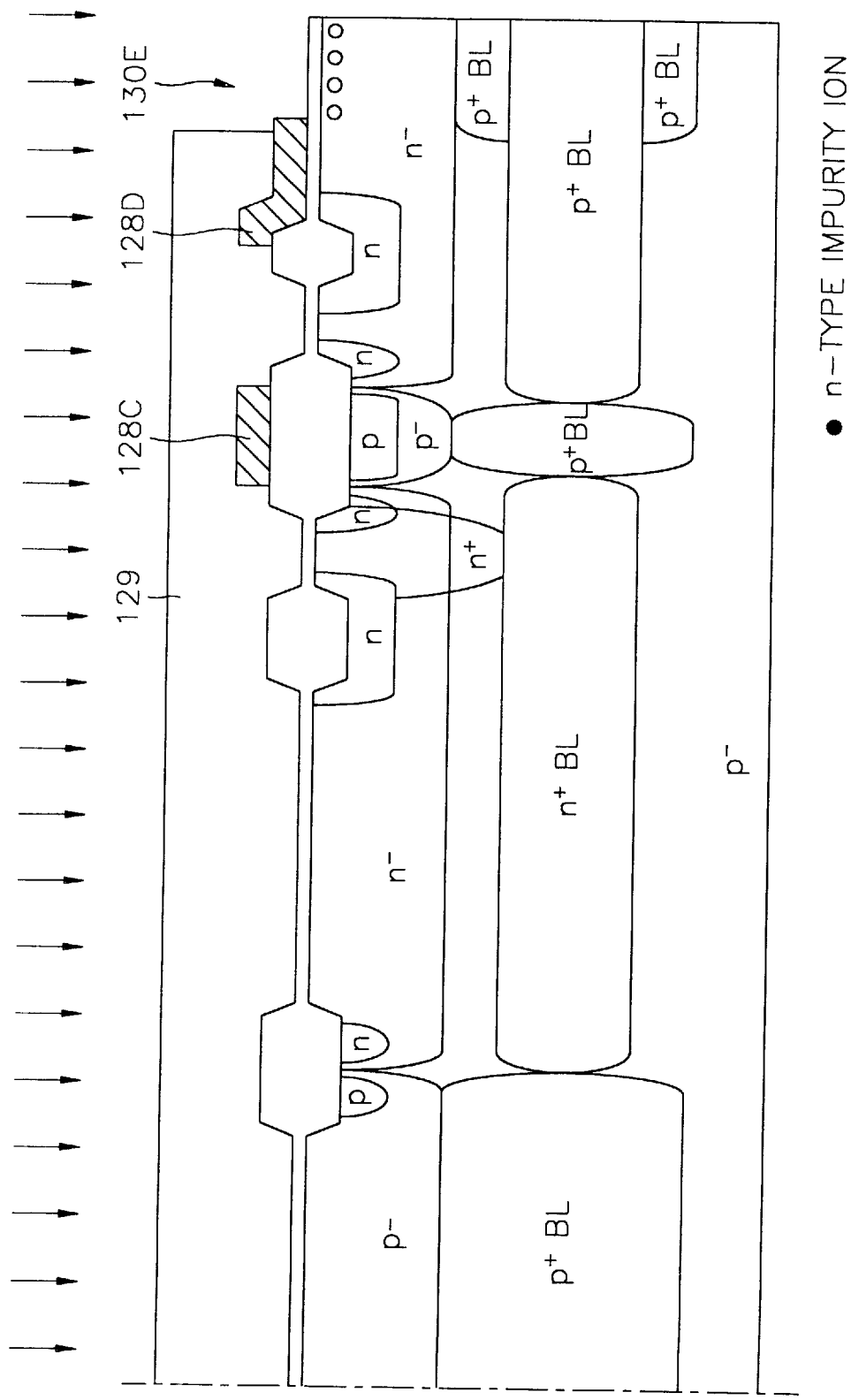

Referring to FIGS. 14A and 14B, a photoresist layer is coated on the polysilicon layer 128. A photoresist layer pattern (not shown) is formed, using a typical photolithographic method. Then, first through fourth polysilicon layer patterns 128A, 128B, 128C and 128D are formed using the photoresist layer pattern as an etching mask. The first polysilicon layer pattern 128A is used as a gate conductive layer of an LDPMOS transistor, the second polysilicon layer pattern 128B is used as a polysilicon resistance , the third polysilicon layer pattern 128C is used as a polysilicon storage node of a capacitor, and the fourth polysilicon layer pattern 128D is used as a gate conductive layer of an LDNMOS transistor. The photoresist layer pattern (not shown) is removed, and then a photoresist layer is coated on the entire surface of the resultant structure. Also, a photoresist layer pattern 129, an ion implantation mask for forming a p-type body region, is formed using a typical photolithographic process. The photoresist layer pattern 129 includes an opening 130A exposing a drain region of the LDPMOS transistor, an opening 130B exposing the source/drain contact region of a high voltage PMOS transistor, an opening 130C exposing the well-bias contact region of an NMOS transistor and an opening 130E exposing the p-type body region of the LDNMOS transistor. P-type impurity ions, e.g., boron ions are implanted using the photoresist layer pattern 129 as an ion implantation mask. Here, preferably, the implantation concentration of the p-type impurity ions is $2 \times 10^{13} \sim 3 \times 10^{13}$ atoms/cm$^2$.

Figure 15B:
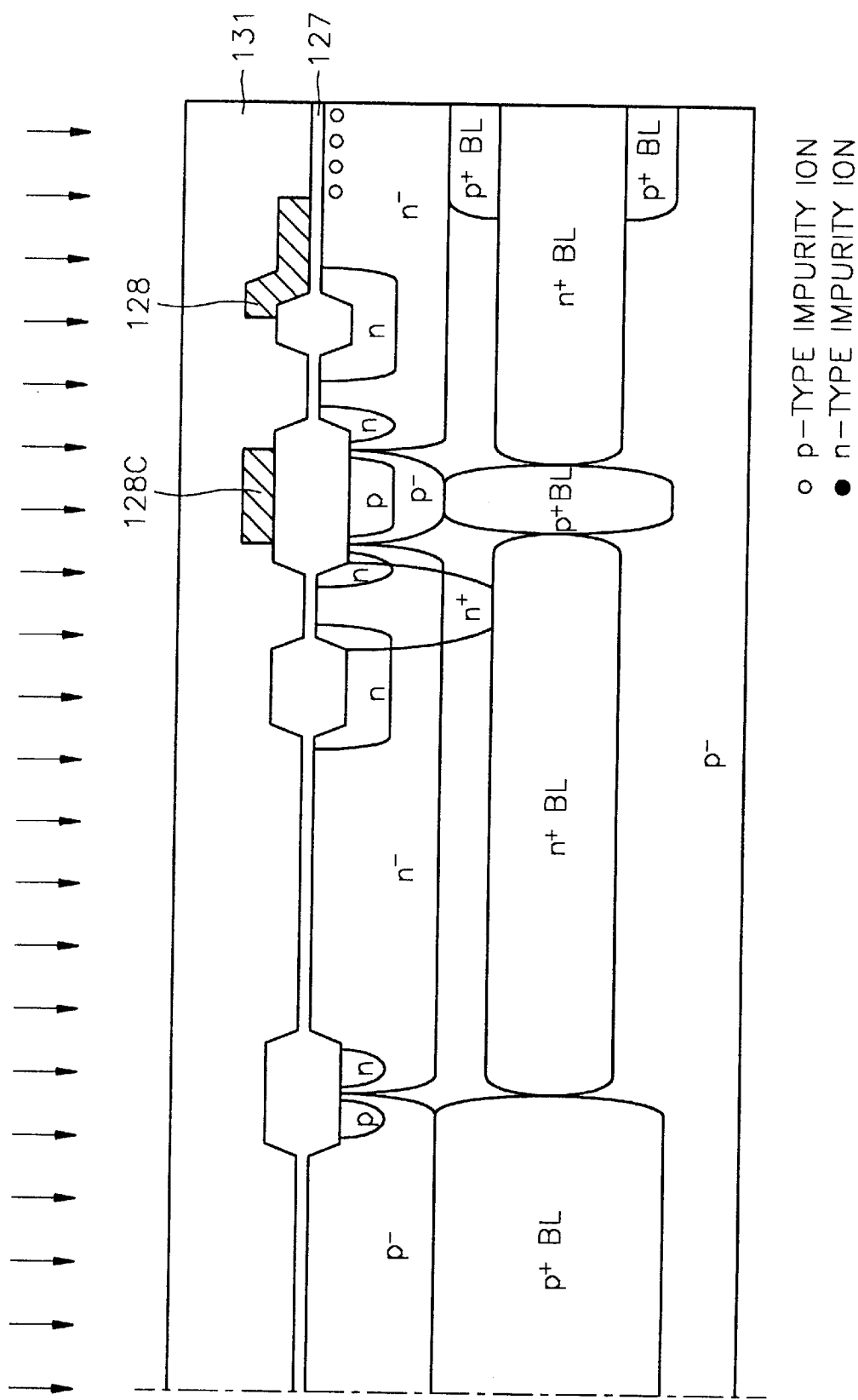

Referring to FIGS. 15A and 15B, the photoresist layer pattern 129 is removed, and then a photoresist layer is coated on the entire surface of the resultant structure. The photoresist layer is patterned to form a photoresist layer pattern 131, an ion implantation mask for forming an n-type body region. The photoresist layer pattern 131 includes an opening 131A exposing the n-type body region of the LDPMOS transistor and an opening 131B exposing a well-bias contact region of the high voltage PMOS transistor. Then, n-type impurity ions, e.g., phosphor ions, are implanted using the photoresist layer pattern 131 as an ion implantation mask. Here, preferably, the concentration of the n-type impurity ions is $1 \times 10^{13} \sim 2 \times 10^{13}$ atoms/cm$^2$.

FIGS. 16A through 18B are sectional views illustrating the steps of forming a body region, implanting impurity ions into a channel region, forming a gate conductive layer of a MOS transistor, and implanting impurity ions for forming a base region of a bipolar transistor.

Figure 16A:
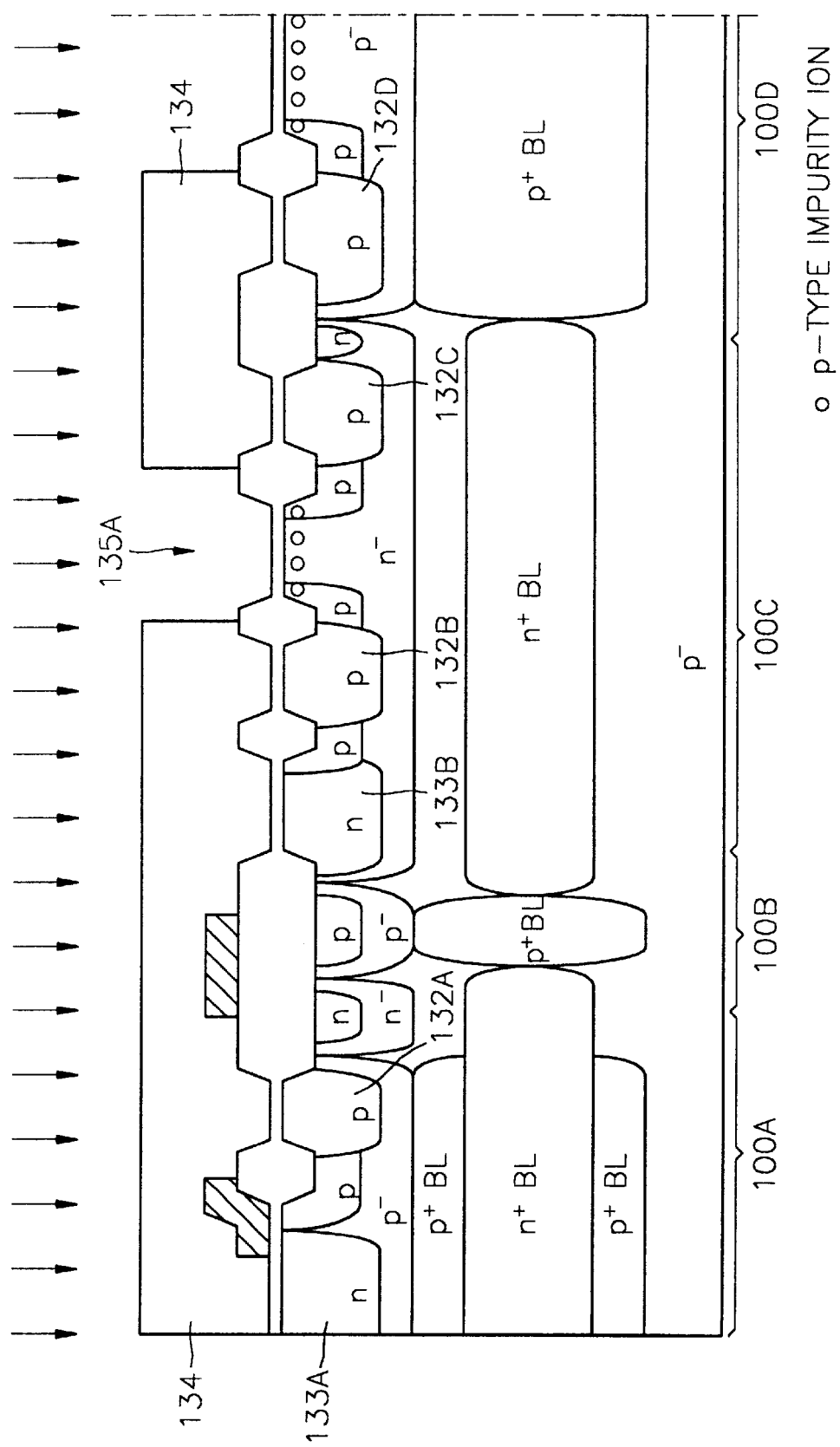
Figure 16B:
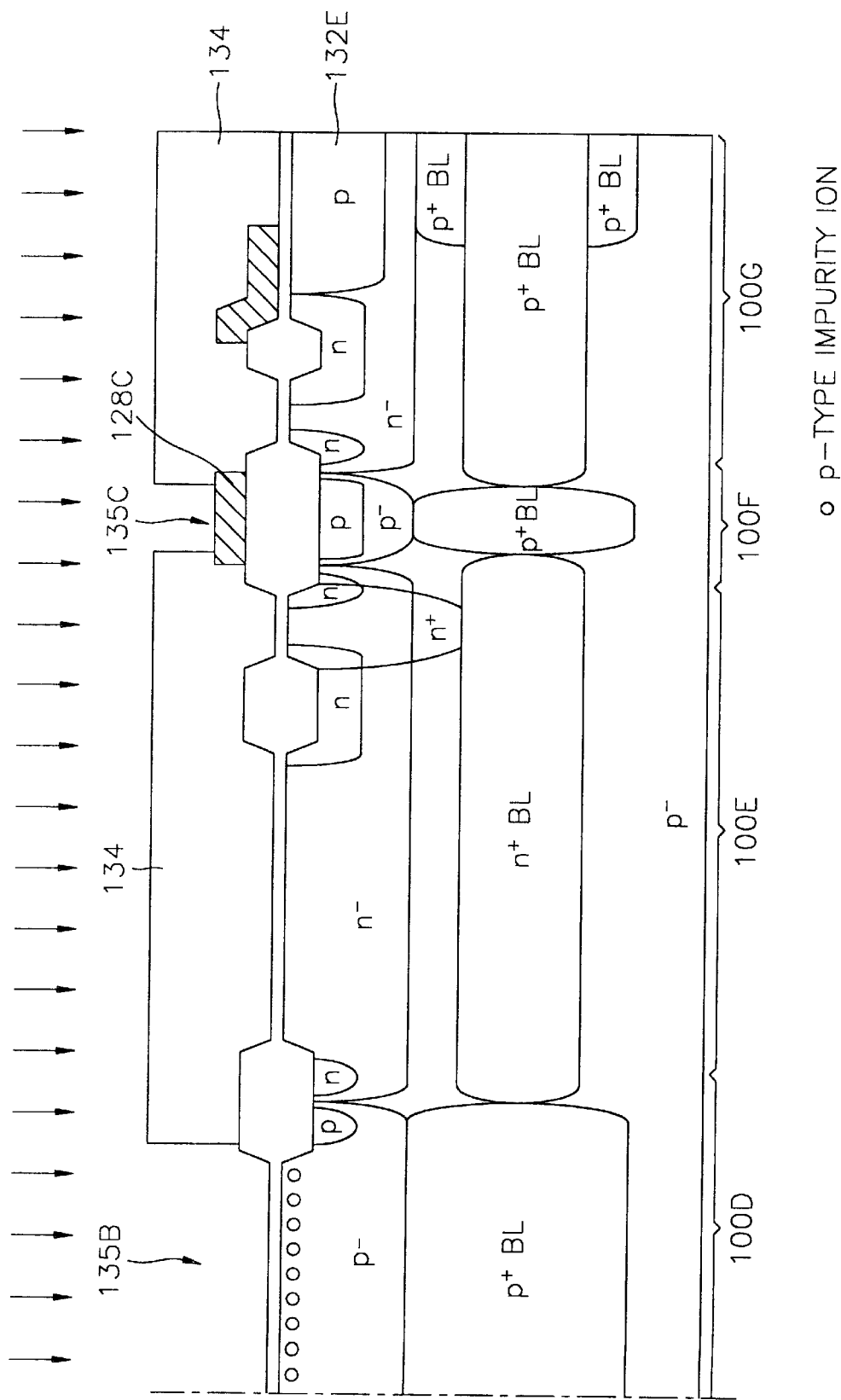

Referring to FIGS. 16A and 16B, a drive-in diffusion process with respect to p-type and n-type impurity ions is performed after removing the photoresist layer pattern 131. The diffusion process is performed at 110° C. for 60~100 minutes. Then, p-type body regions 132A through 132E and n-type body regions 133A and 133B are formed. During the diffusion process, impurity ions implanted to form the p-type and n-type field regions in the former process as well as impurity ions implanted to form p-type and n-type body regions are diffused. Then, a photoresist layer is coated on the entire surface of the resultant structure, and a photoresist layer pattern 134 is formed by patterning the photoresist layer, using a channel gate oxide mask. The photoresist layer pattern 134 includes an opening 135A exposing a channel region of the high voltage PMOS transistor region 100C, an opening 135B exposing the channel region of the NMOS transistor region 100D and an opening 135C exposing the storage node 128c of the capacitor region 100F. Then, a channel region of the high voltage PMOS transistor and the NMOS transistor is formed, using the photoresist layer pattern 134 as an ion implantation mask, and impurity ions for controlling the concentration of the impurity of the storage node of the capacitor are implanted. Preferably, boron ions are used as the impurity, and the concentration of the implantation is $6 \times 10^{11} \sim 8 \times 10^{11}$ atoms/cm$^2$.

Figure 17A:
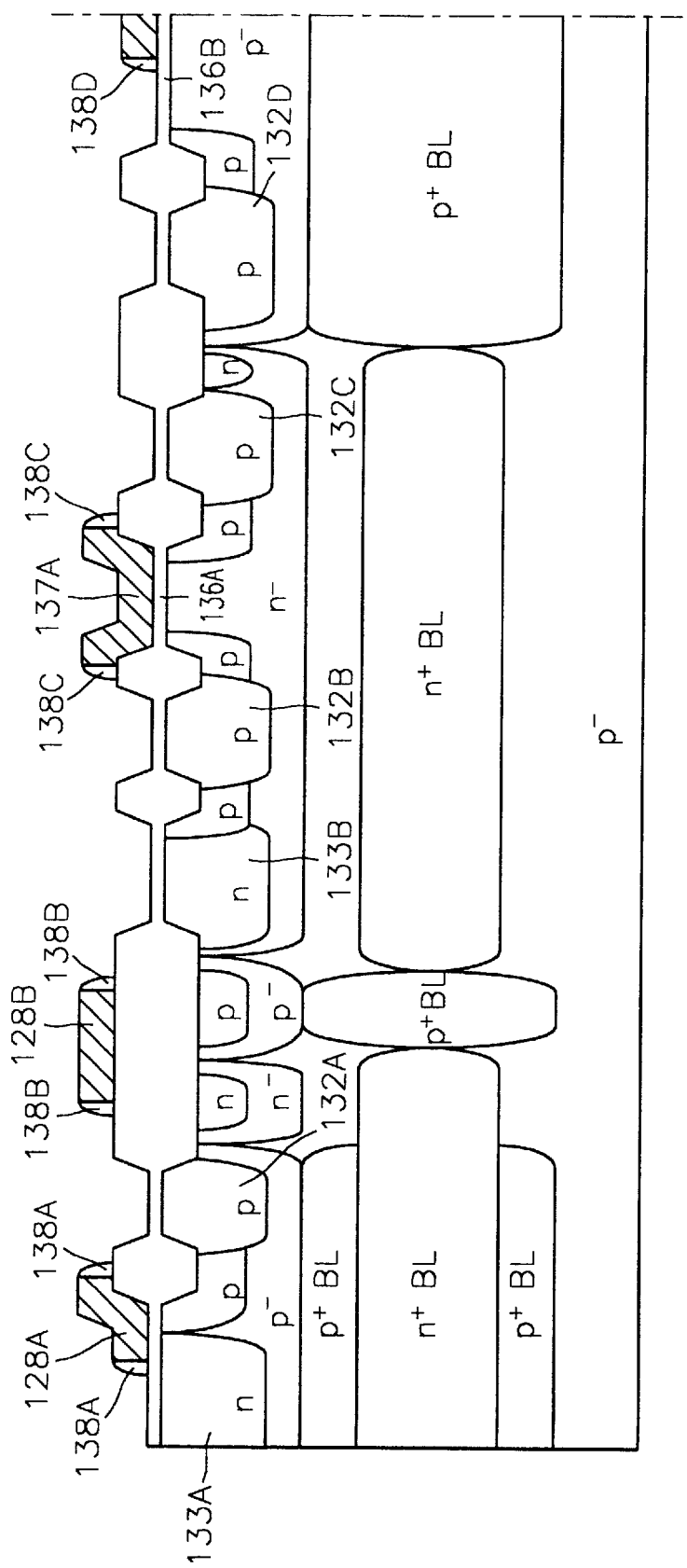
Figure 17B:
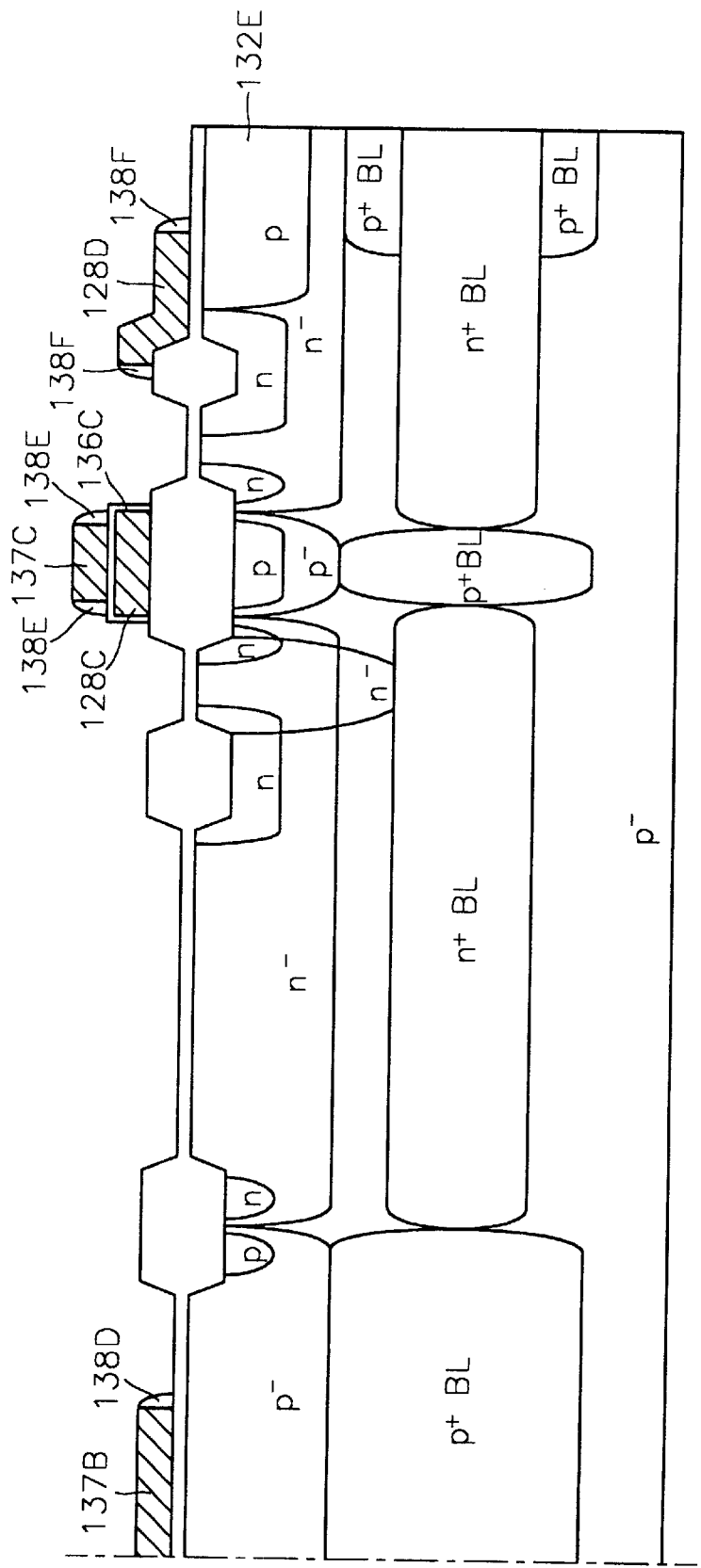

Referring to FIGS. 17A and 17B, an oxide layer of a region exposed by the photoresist layer pattern 134 is removed, and then the oxide layer, i.e., the gate oxide layer 136A of the high voltage PMOS transistor and the gate oxide layer 136B of the NMOS transistor, is regrown to remove damage of the oxide layer due to impurity ion implantation. Preferably, the thickness of each of the regrown gate oxide layers 136A and 136B are 250~300 Å. An oxide layer 136C, a dielectric layer, is formed on the storage node 128C of the capacitor.

Then, a polysilicon layer is coated on the entire surface of the substrate 100 to 3,000~4,000 A. Also, impurity ions are implanted in a high concentration or a phosphor oxychloride is deposited to control the conductivity rate of the polysilicon layer. Then, a photoresist layer pattern (not shown) is formed on the polysilicon layer using a mask for forming a gate conductive layer. Also, the polysilicon layer is etched using the photoresist layer pattern as an etching mask to define a gate conductive layer 137A of the high voltage PMOS transistor, a gate conductive layer 137B of the NMOS transistor and a plate node 137C of a capacitor.

Then, an insulating layer of a predetermined thickness is coated on the entire surface of the resultant structure and then the coated insulating layer is etched by dry etching. Thus, spacers 138A, 138C, 138D 138F are formed on the sidewalls of the gate conductive layer 128A of the LDPMOS transistor, the gate conductive layer 137A of the PMOS transistor high voltage, the gate conductive layer 137B of the NMOS transistor and the gate conductive layer 128D of the LDNMOS transistor, respectively, and at the same time, spacers 138B and 138E are formed on the sidewalls of the resistance 128B and the plate node 137C of the capacitor, respectively.

Figure 18A:
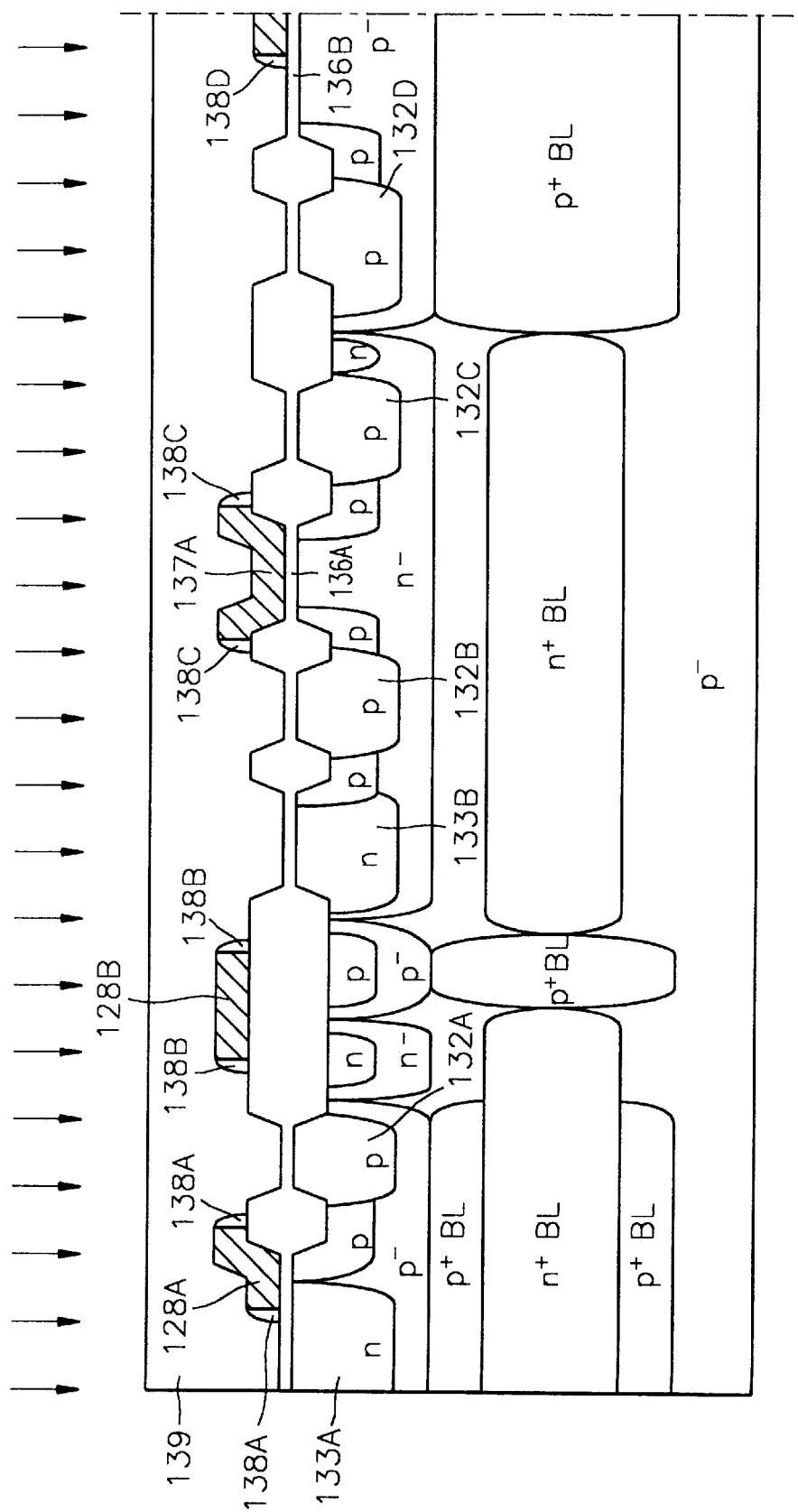
Figure 18B:
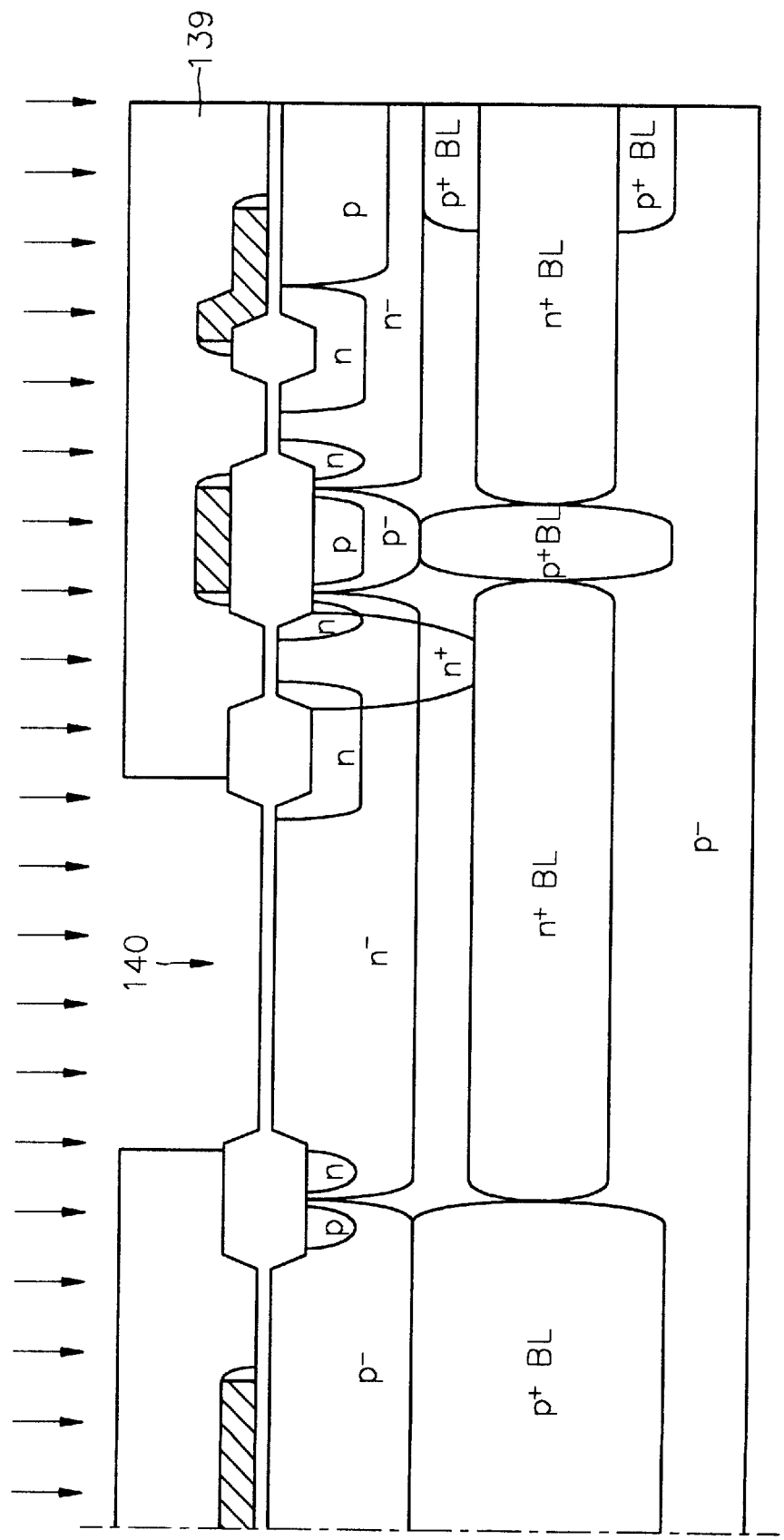

Referring to FIGS. 18A and 18B, a photoresist layer is coated on the entire surface of the substrate 100, and then the resultant structure is patterned to form a photoresist layer pattern 139 having an opening 140 that exposes a base region of an npn bipolar transistor. Also, p-type impurity ions, e.g., boron ions, are implanted, using the photoresist layer pattern 139 as an ion implantation mask. The p-type impurity ions are implanted at 50~80 KeV to have a concentration of $5 \times 10^{13} \sim 7 \times 10^{13}$ atoms/cm$^2$.

FIGS. 19A through 22B are sectional views illustrating the steps of forming source and drain regions of a MOS transistor, and forming a base region, an emitter region and a collector region of a bipolar transistor.

Figure 19A:
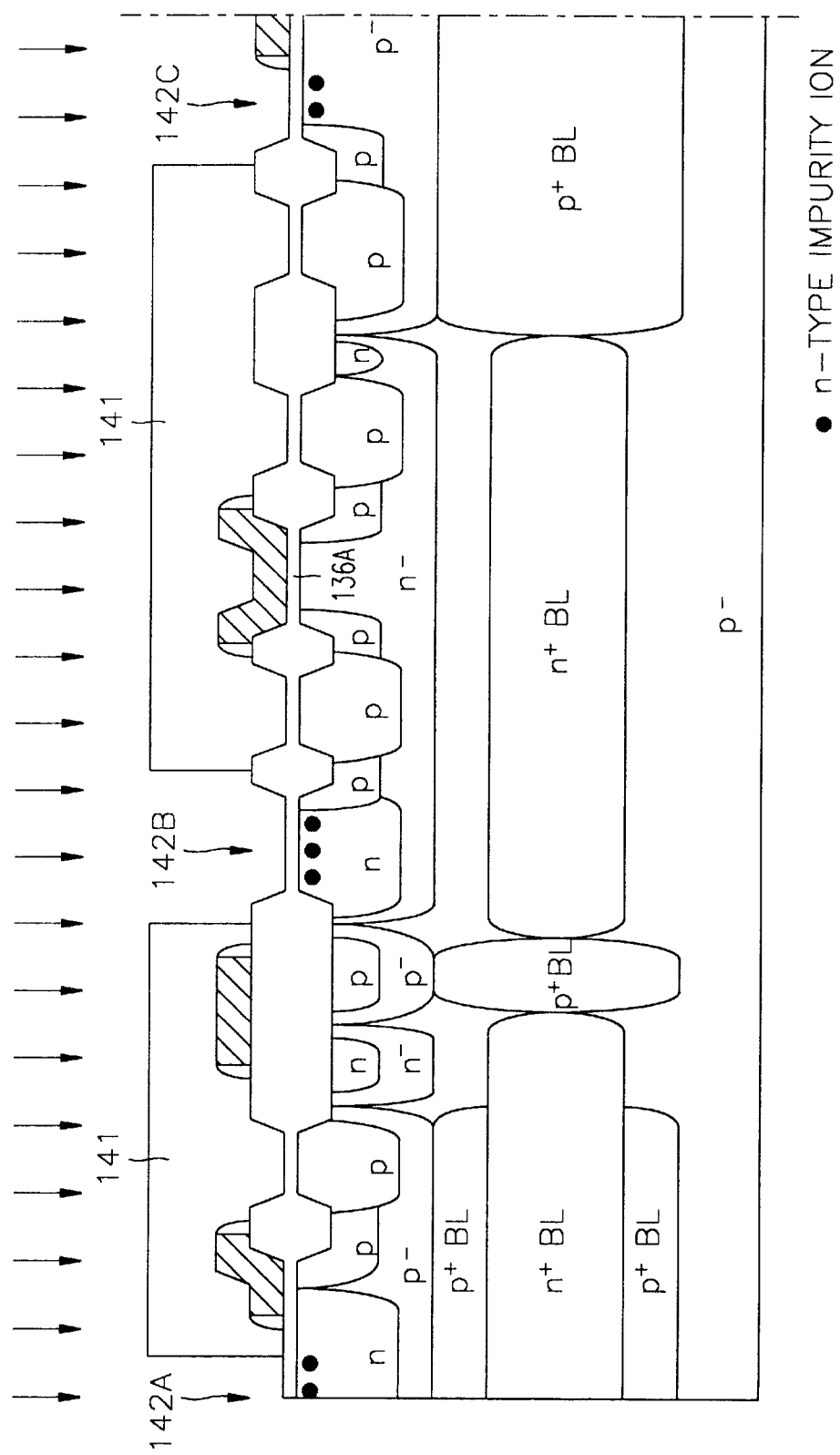
Figure 19B:
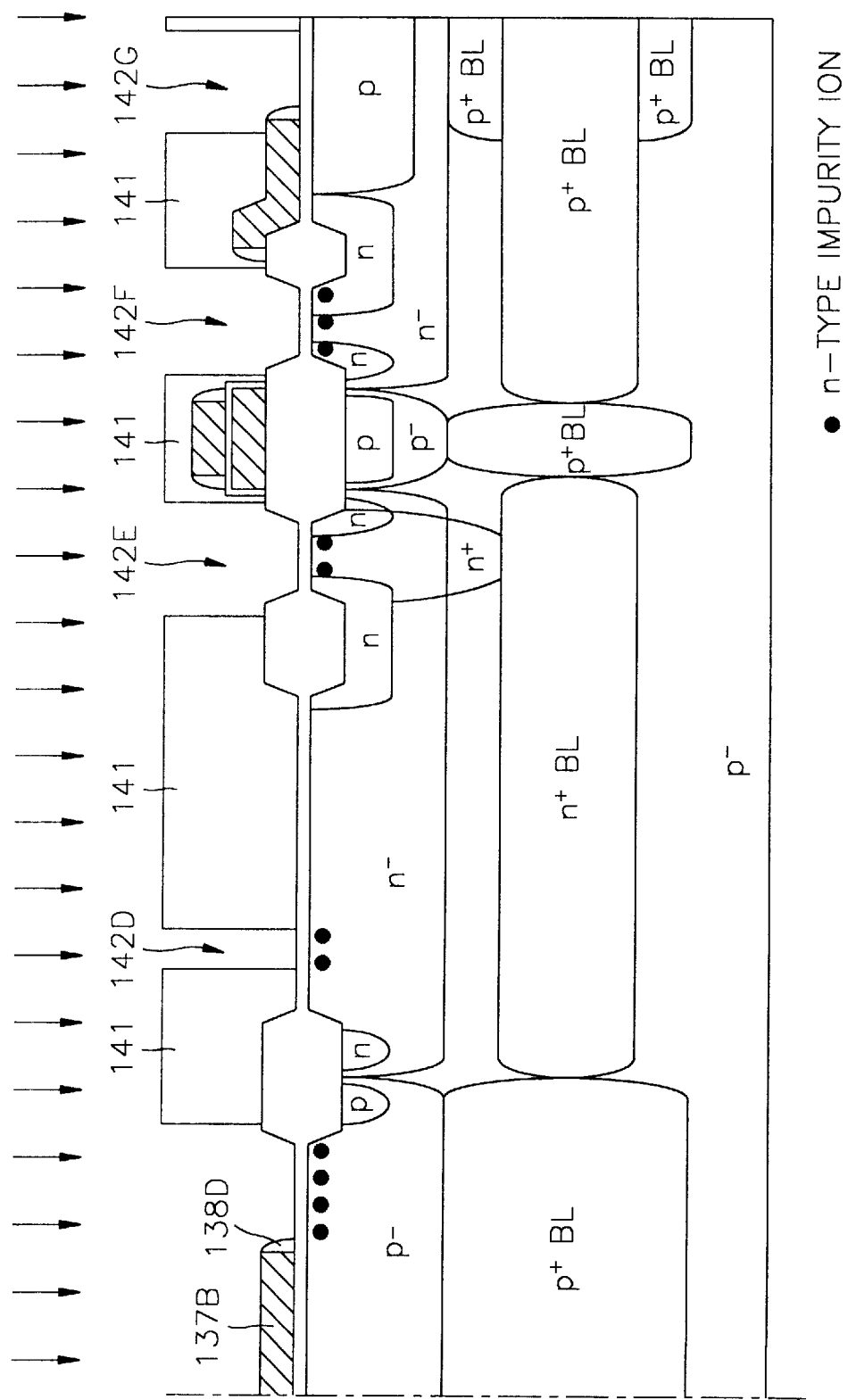

Referring to FIGS. 19A and 19B, the photoresist layer pattern 139 is completely removed, and then a photoresist layer pattern 141 is formed. The photoresist layer pattern 141 includes an opening 142A that exposes a source contact region of the LDPMOS transistor, an opening 142B that exposes a well-bias contact region of the high voltage PMOS transistor, an opening 142C that exposes a source region and a drain region of the NMOS transistor, openings 142D and 142E that exposes an emitter region and a collector region of the npn transistor and openings 142F and 142G that exposes source and drain regions of the LDNMOS transistor. N-type impurity ions are simultaneously implanted into the entire surface of the resultant structure, using the photoresist layer pattern 141 as an ion implantation mask. Here, different arsenic and phosphor concentrations are simultaneously implanted, such that the source and drain regions of the MOS transistor is formed as a double diffused drain (DDD) structure. The concentration of the arsenic is $6 \times 10^{15}$ atoms/cm$^2$, and the concentration of the phosphor is $1 \times 10^{14}$ atoms/cm$^2$.

Figure 20A:
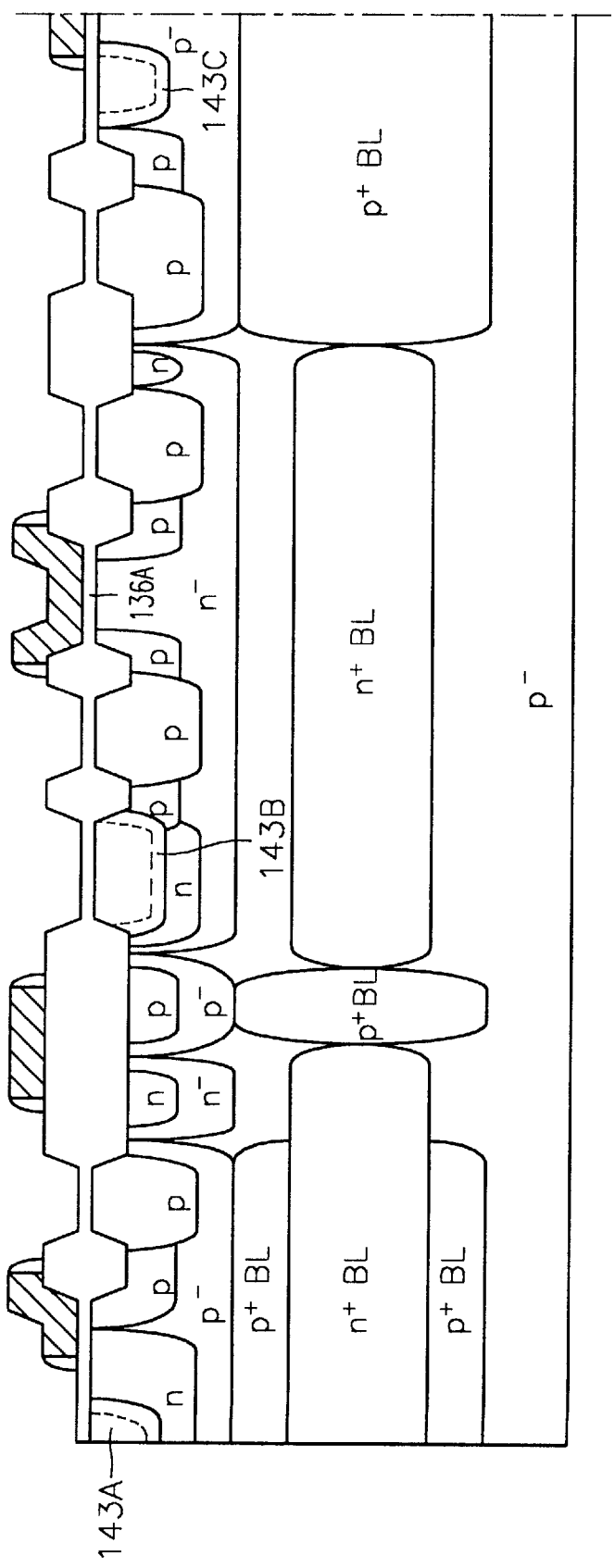
Figure 20B:
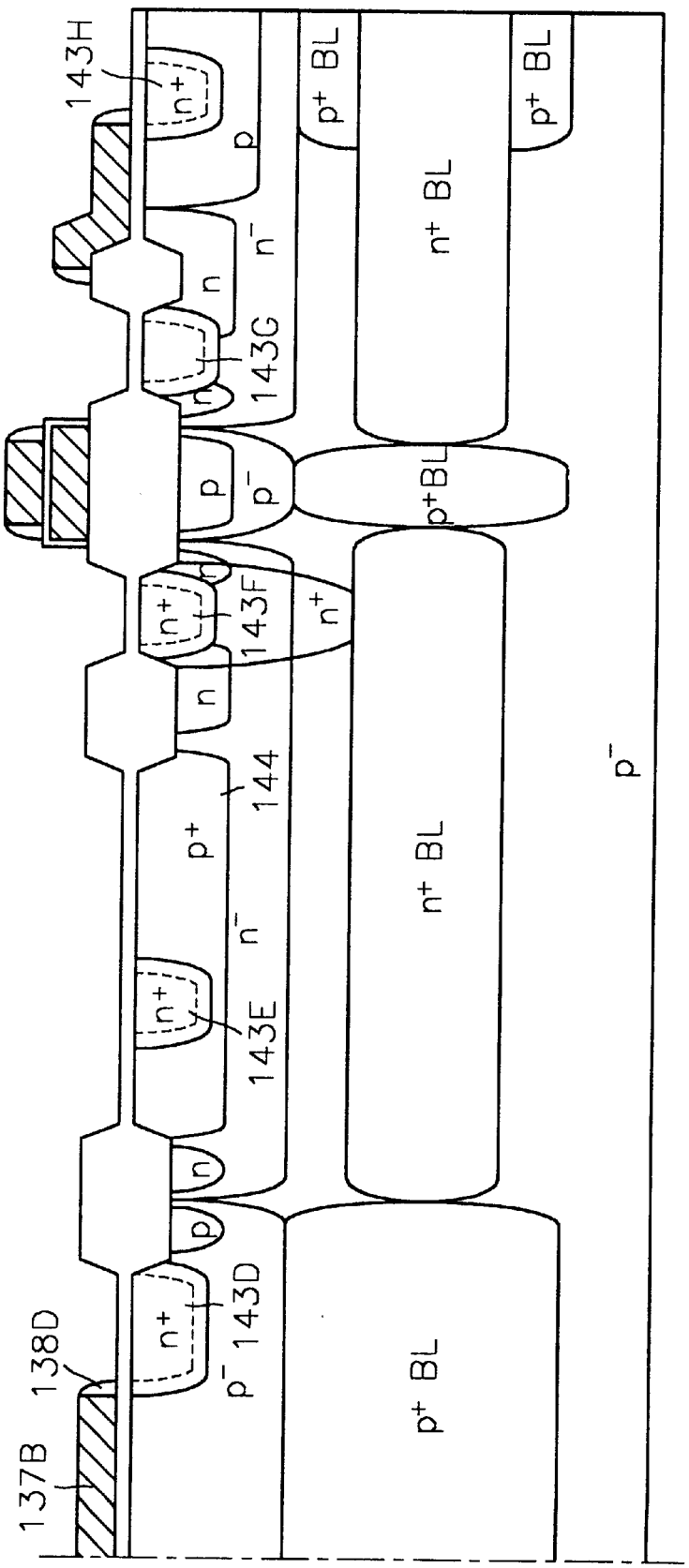

Referring to FIGS. 20A and 20B, the photoresist layer pattern 141 is completely removed, and a drive-in process in which annealing is performed at a predetermined temperature for a predetermined time is performed. That is, the impurity ions which have been implanted in the former process are diffused by annealing at 950° C. for 20~30 minutes. Thus, a source contact region 143A of the LDPMOS transistor is formed, a well-bias contact region 143B of the high voltage PMOS transistor is formed, a source region and a drain region 143D of the NMOS transistor are formed, an emitter region 143E, a collector region 143F and a base region 144 of the npn bipolar transistor are formed, and a drain region 143G and a source region 143H of the LDNMOS transistor are formed.

Figure 21A:
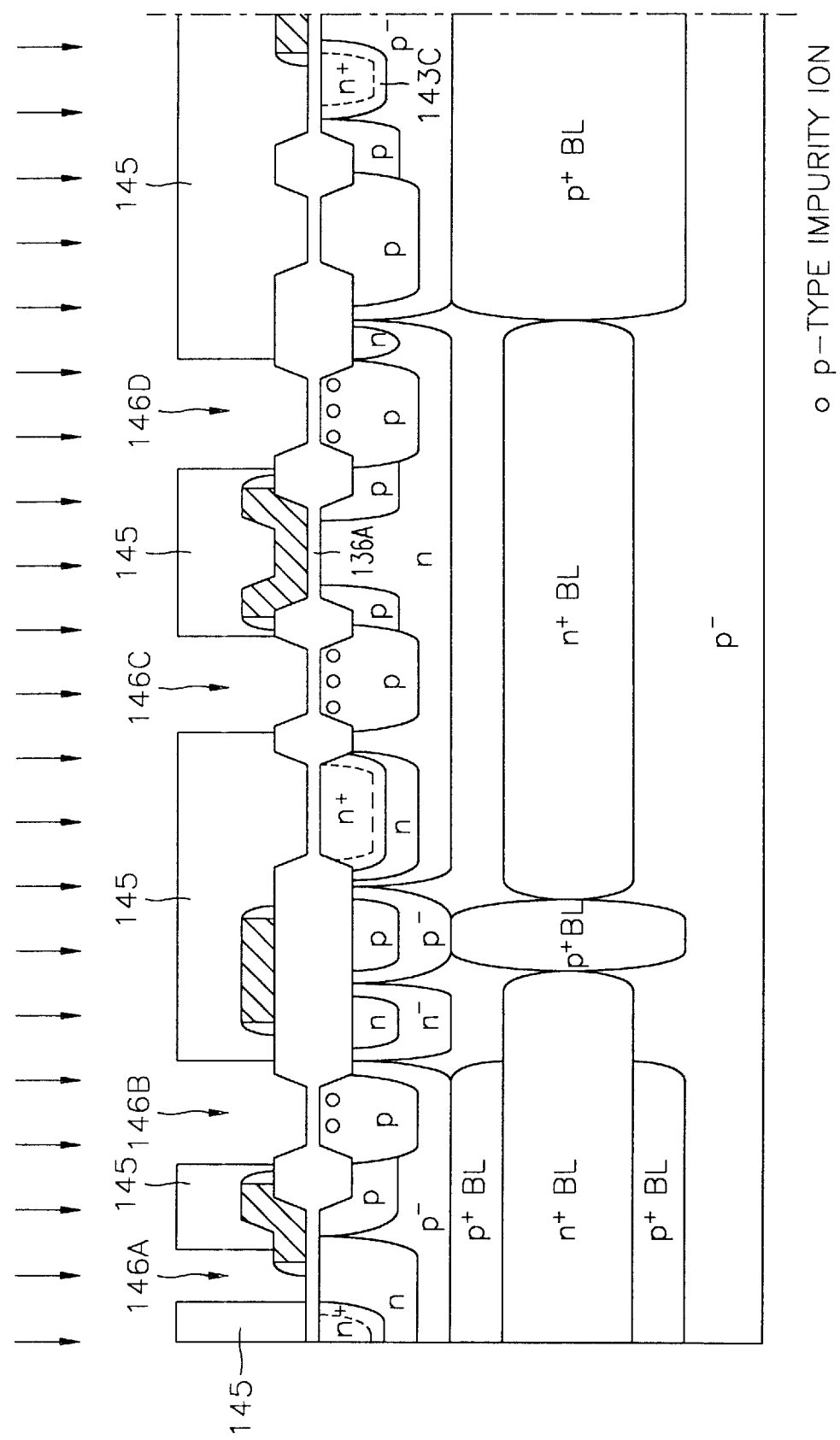
Figure 21B:
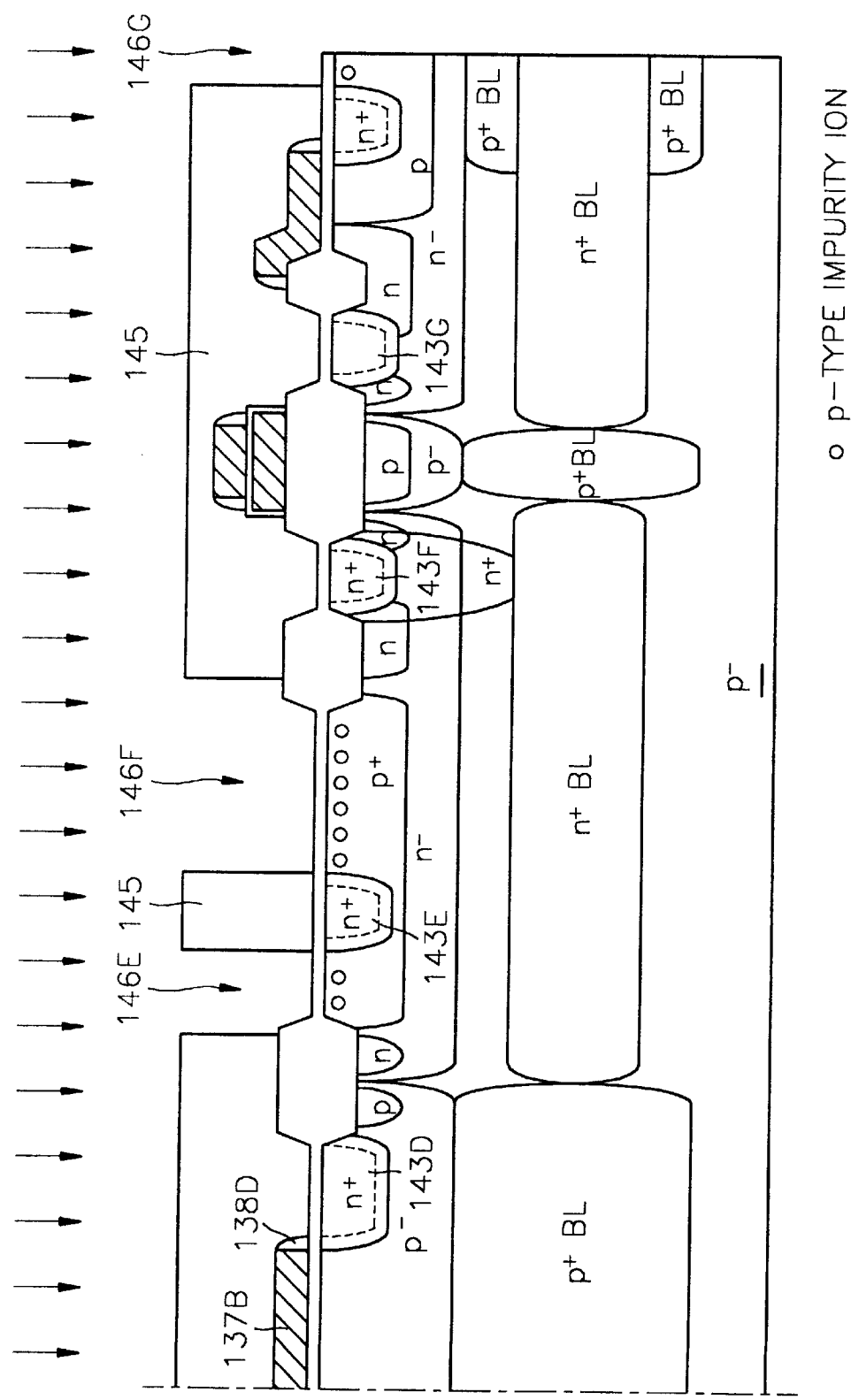

Referring to FIGS. 21A and 21B, a photoresist layer is coated on the entire surface of the resultant structure. A photoresist layer pattern 145 exposing a predetermined region is formed by exposure and development using a typical photolithographic method. That is, the photoresist layer pattern 145 includes openings 146A and 146B exposing source and drain regions of the LDPMOS transistor, openings 146C and 146D exposing source and drain regions of the high voltage PMOS transistor, an opening 146E exposing a well-bias contact region of the NMOS transistor, an opening 146F exposing a base region of the npn transistor and an opening 146G exposing a source contact region of the LDNMOS transistor. P-type impurity ions are simultaneously implanted into the entire surface of the resultant structure using the photoresist layer pattern 145 as an ion implantation mask. Boron or $BF_2$ is used as the p-type impurity ion, and the concentration of the ion implantation is $6 \times 10^{15}$ atoms/cm$^2$.

Figure 22A:
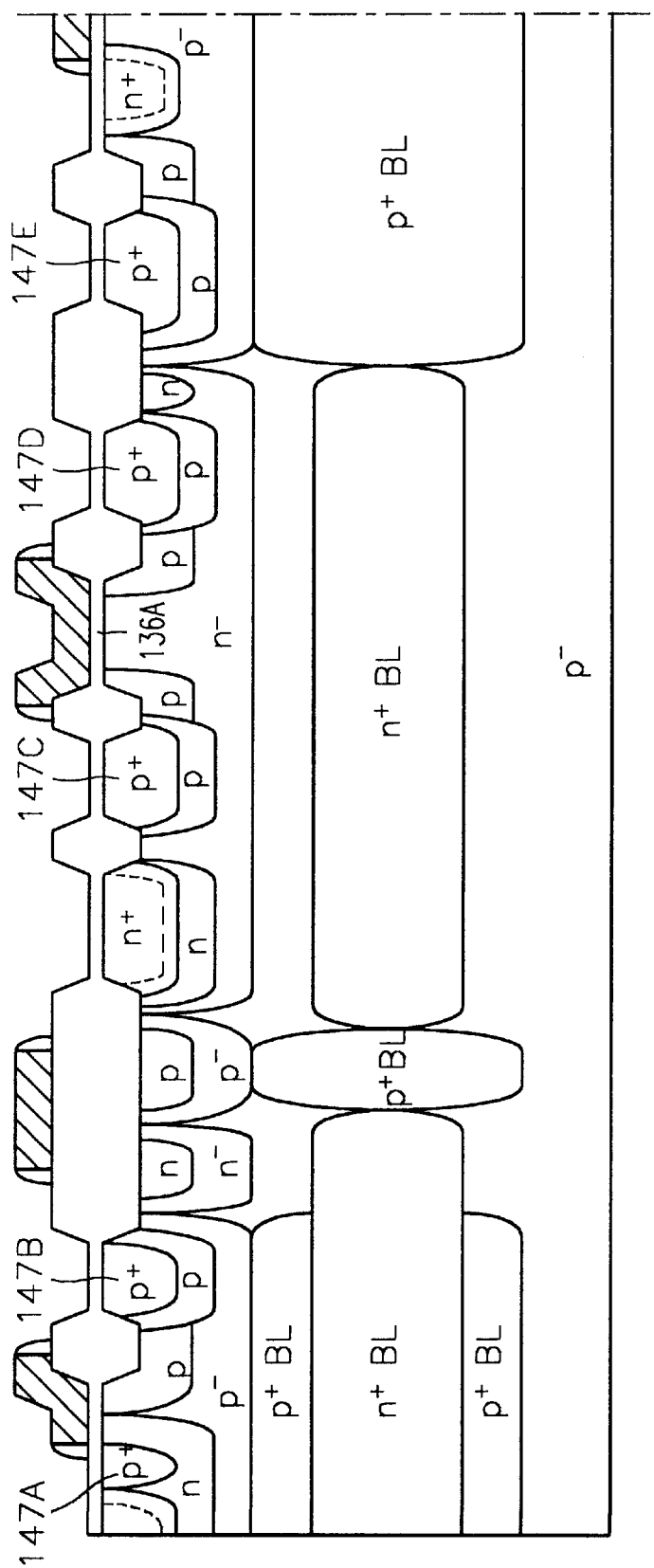
Figure 22B:
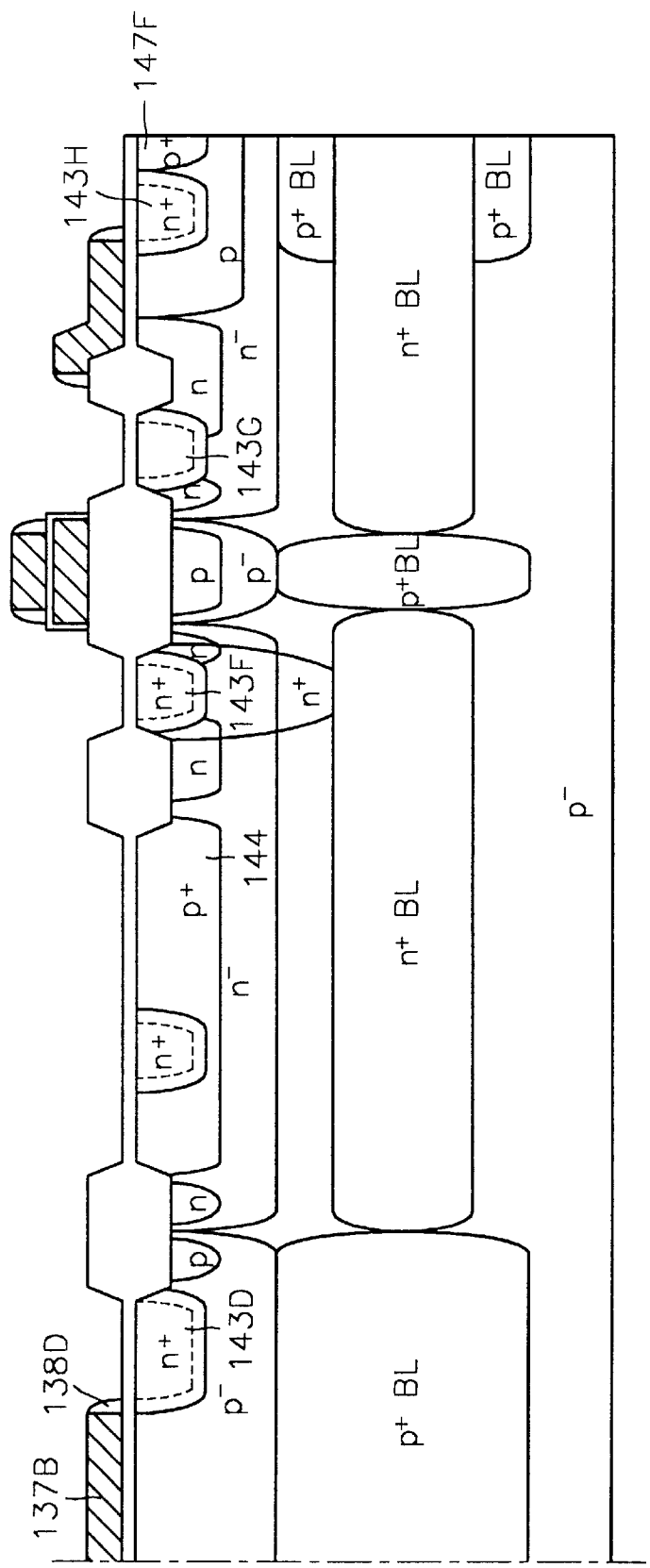

Referring to FIGS. 22A and 22B, the photoresist layer pattern 145 is completely removed, and spacers are densified by annealing at 850° C. for 30 minutes. Here, p-type impurity ions are diffused. A source region 147A and a drain region 147B of the LDPMOS transistor are formed, a source region 147C and a drain region 147D of the high voltage PMOS transistor are formed, and a well-bias contact region 147E of the NMOS transistor is formed. Also, the base region 144 of the npn bipolar transistor is slightly enlarged, and a source contact region 147F of the LDNMOS transistor is formed.

FIGS. 23A through 24B are sectional views illustrating the steps of forming various contacts, and performing a metallization process.

Figure 23A:
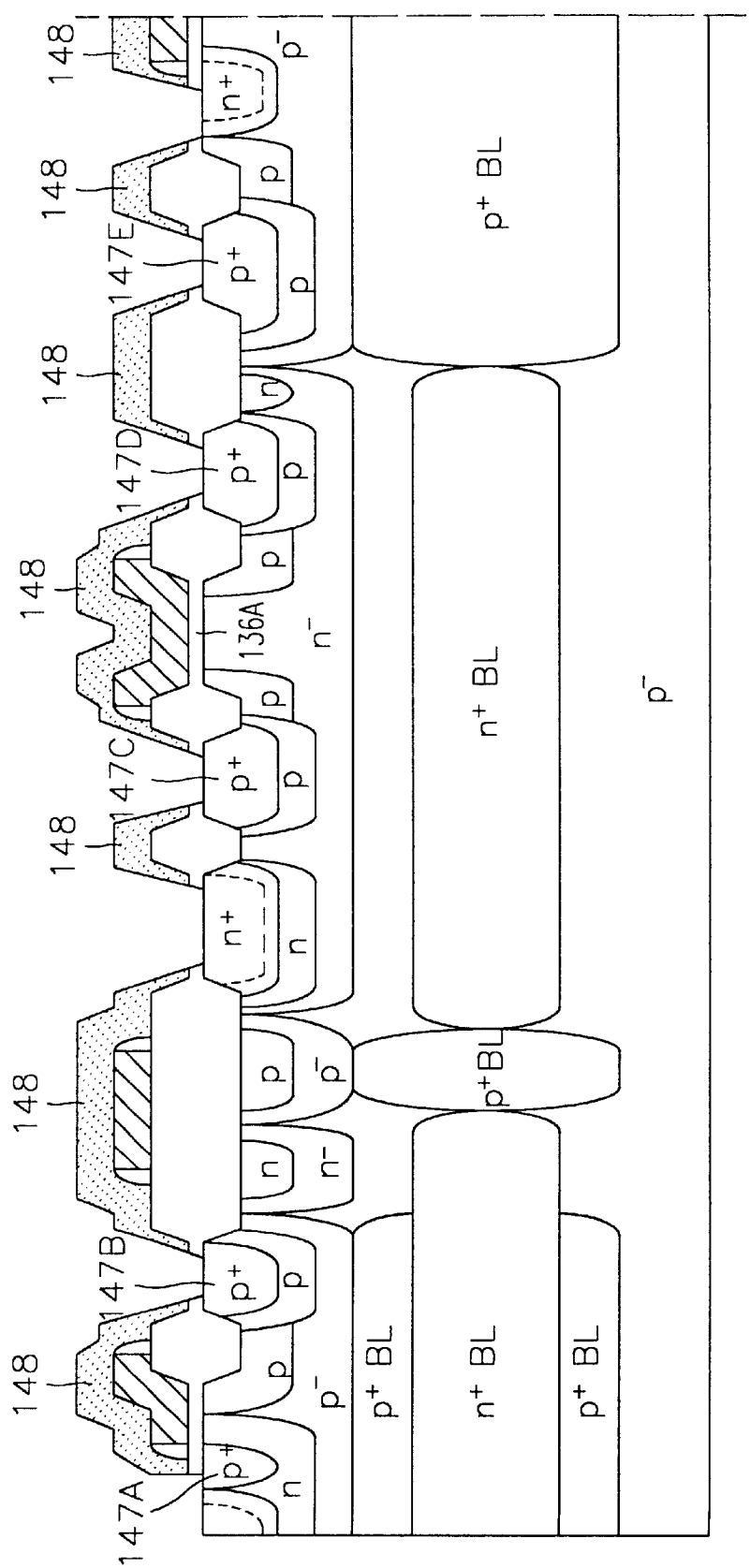
Figure 23B:
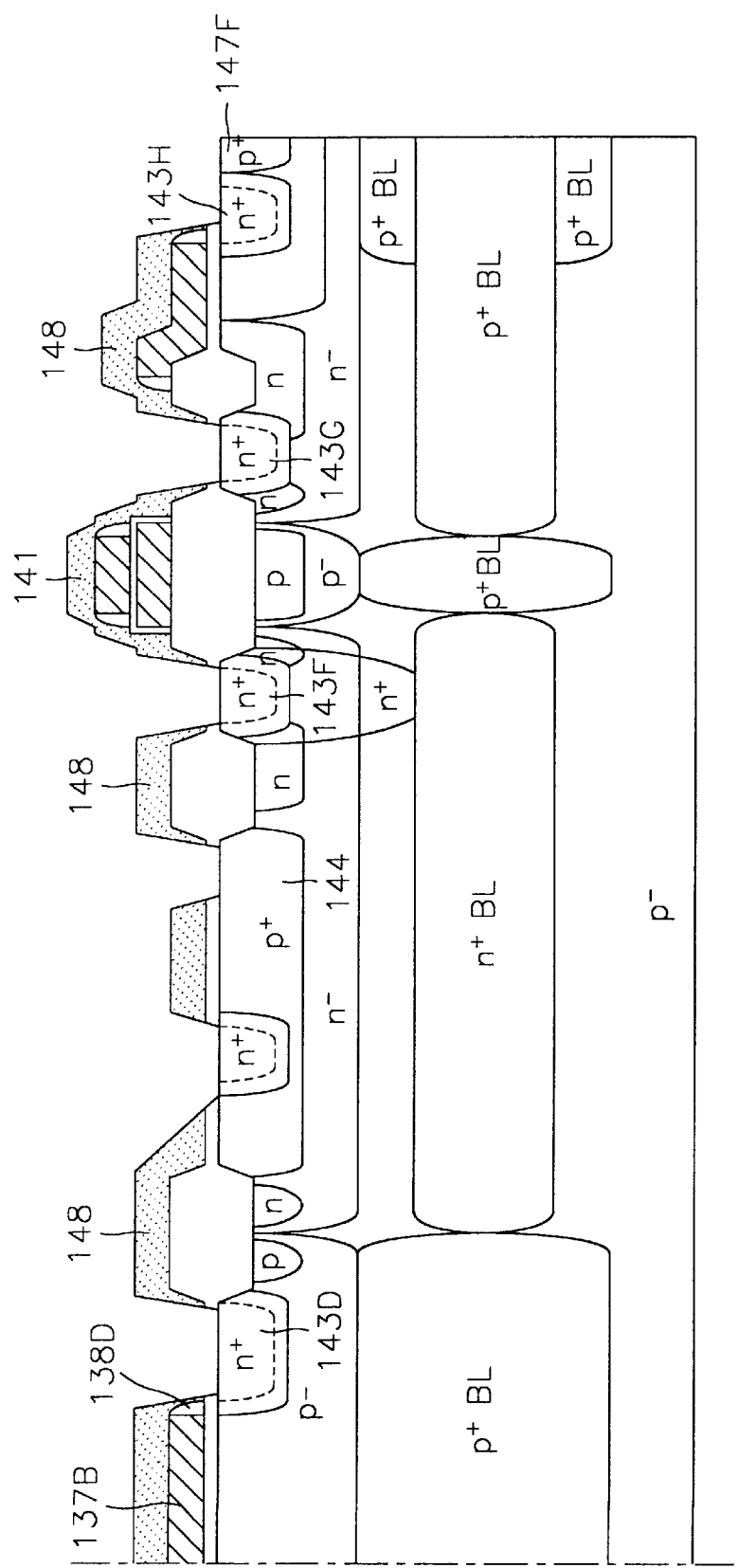

Referring to FIGS. 23A and 23B, an insulating layer 148 is coated on the entire surface of the resultant structure. Here, a boron-phosphor silicon glass layer can be used as the insulating layer 148. In the case of using the BPSG layer, the BPSG is reflowed at approximately 900° C. for 30 minutes. Subsequently, a photoresist layer pattern is formed, using a typical photolithographic method, and then the insulating layer 148 is etched using the photoresist layer pattern as an etching mask to form a contact hole.

Figure 24A:
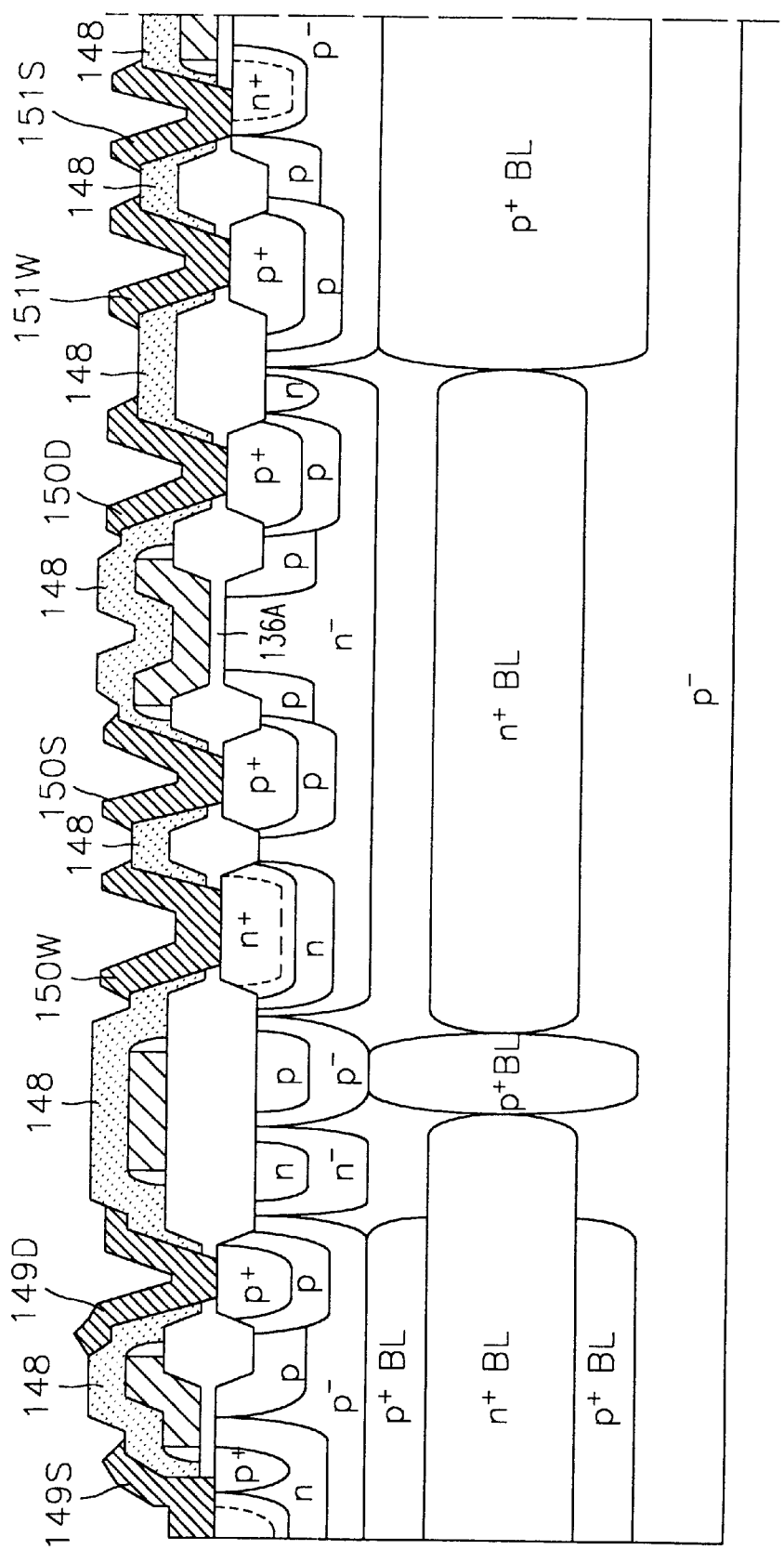
Figure 24B:
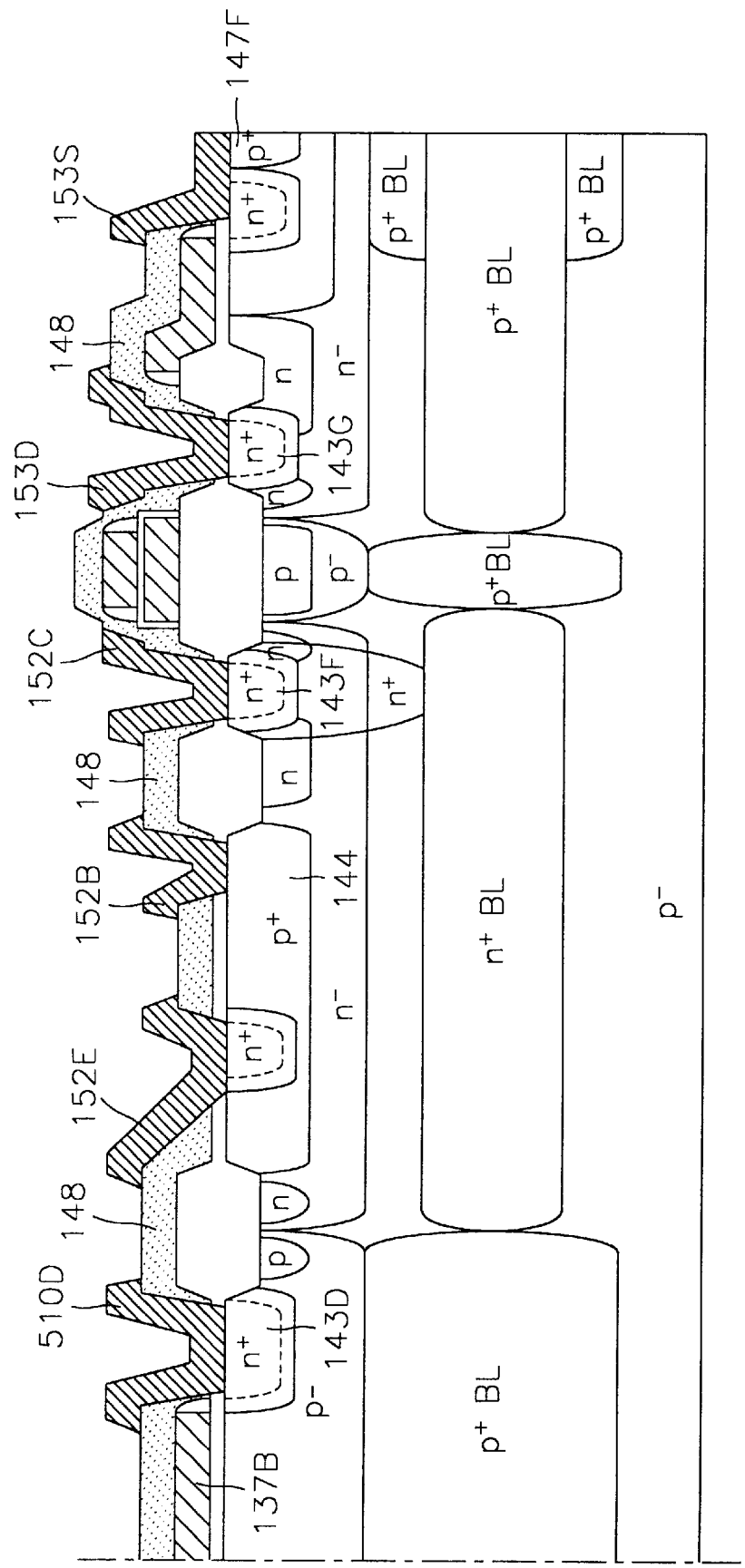

Referring to FIGS. 24A and 24B, a metal layer is deposited on the entire surface of the resultant structure. The deposited metal layer is patterned to form electrodes of each of the devices. That is, a source electrode 149S and a drain electrode 149D of the LDPMOS transistor, a well-bias contact electrode 150W, a source electrode 150S and a drain electrode 150D of the high voltage PMOS transistor, a well-bias contact electrode 151W, a source electrode 151S and a drain electrode 151D of the NMOS transistor, an emitter electrode 152E, a base electrode 152B and a collector electrode 152C of the npn bipolar transistor, and a drain electrode 153D and a source electrode 153S of the LDNMOS transistor are formed to complete a BiCDMOS device.

Figure 25:
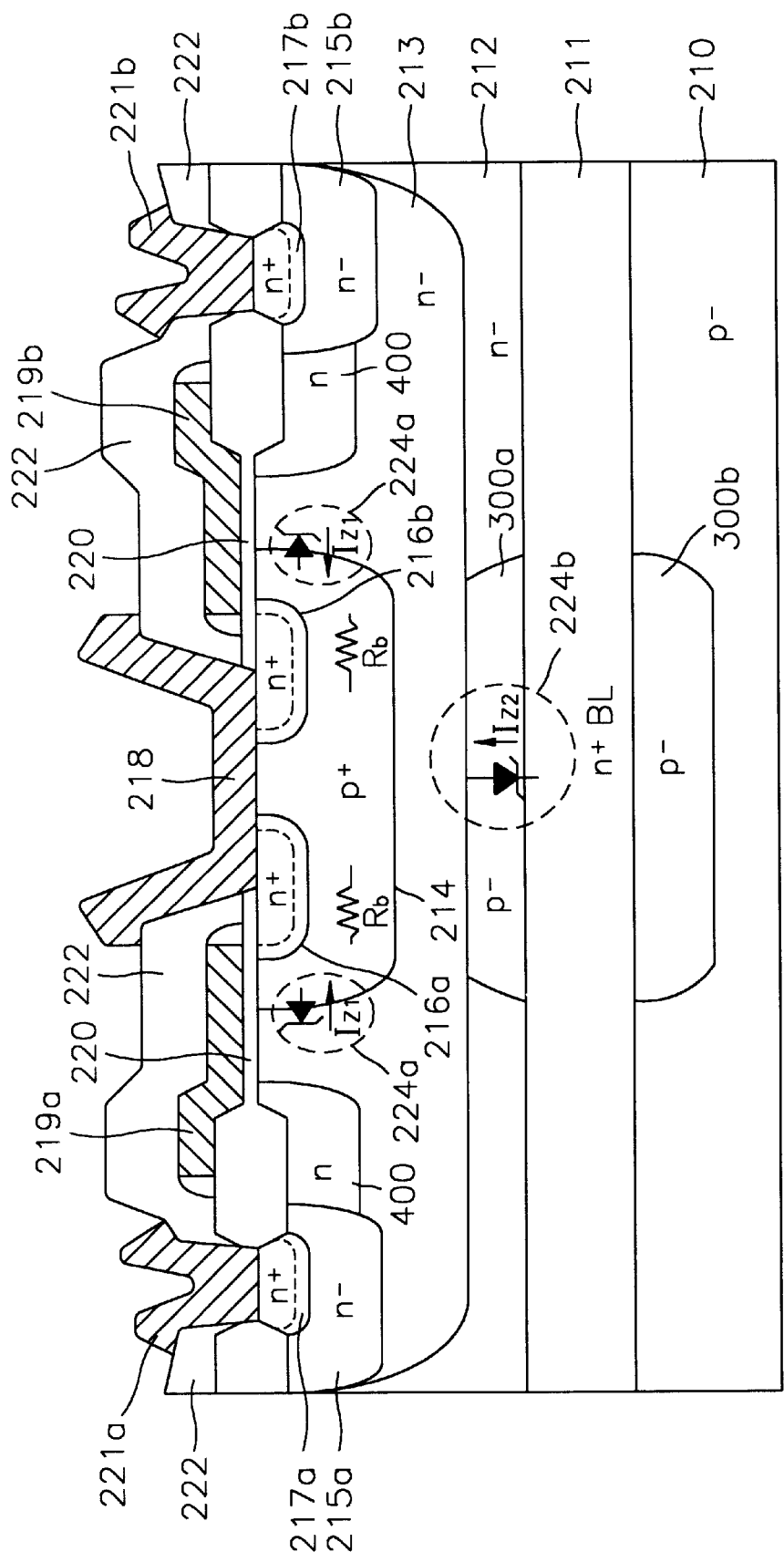
FIG. 25 is a sectional view of a DMOS electric field effect transistor included in the BiCDMOS fabricated by a method according to the present invention.

FIG. 25 is a sectional view of the structure of a DMOS transistor included in a BiCDMOS device according to the present invention. Here, only two adjacent cells sharing a source electrode are shown.

Referring to FIG. 25, an n-type highly-doped buried layer 211 is arranged on a p-type semiconductor substrate 210, and an n-type lightly-doped epitaxial layer 212 is arranged on the n-type buried layer 211. An n-type lightly-doped well region 213 is arranged on the n-type lightly-doped epitaxial layer 212. N-type lightly-doped body regions 215a and 215b are arranged in a predetermined region of the n-type well region 213, spaced apart from the p-type body region 214 by a predetermined distance. N-type source regions 216a and 216b are formed in the p-type body region by double diffusion. Meanwhile, n-type drain regions 217a and 217b are formed on the n-type body regions 215a and 215b by double diffusion.

An n-type field region 400 is formed in the well region 213 between the n-type body regions 215a and 215b and the p-type body region 214, and the concentration of impurities of the n-type field region is higher than that of the well region 213. Thus, the resistance of the path in which current flows out through the channel is reduced, so that the current can easily flow.

A source electrode 218 is formed to electrically contact part of the n-type source regions 216a and 216b and the p-type body region 214. Gate electrodes 219a and 219b are formed at the sides of the source electrode 218, spaced apart from the source electrode by a predetermined distance, and connected to part of the n-type source regions 216a and 216b and the p-type body regions 215a and 215b through the gate oxide layer 220. Also, the drain electrodes 221a and 221b electrically contact the drain regions 217a and 217b. The source electrode 218, the gate electrodes 219a and 219b and the drain electrodes 221a and 221b are insulated from each other by an insulating layer 222.

The p-type buried layers 300a and 300b used for isolation are formed, respectively, on and under the n-type buried layer 211. In particular, the p-type buried layer 300a is overlapped with the p-type body region 214 by a predetermined region. Also, a portion in which the n-type buried layer 211 contacts the p-type buried layer 300a forms a second zener diode component 224b, so that most of the zener diode current flows to the ground directly through the source electrode 218 without passing the resistance component $R_b$ under the n-type source regions 216a and 216b of the p-type base region 214. The amount of first zener diode current $I_{z1}$ passing through the resistance $R_b$ through the first zener diode component 224a is reduced, and the amount of second zener diode current $I_{z2}$ through the second zener diode component 224b is increased, thereby suppressing the turn-on phenomenon of a parasitic bipolar transistor.

What is claimed is:

1. A method for fabricating a BiCDMOS device where bipolar, MOS and double diffused MOS devices are formed on a single semiconductor substrate, comprising the steps of:

(a) forming a semiconductor region of a second conductivity type on the semiconductor substrate of a first conductivity type;

(b) forming buried layers of the first conductivity type and buried layers of the second conductivity type corresponding to the predefined arrangement of the well regions, and then forming well regions of the first conductivity type and well regions of the second conductivity type within the semiconductor region in a predefined arrangement;

(c) forming an oxidation passivation layer pattern overlying the well regions, the passivation layer pattern defining a field oxide region where a field oxide layer will subsequently be formed;

(d) implanting impurity ions of the first conductivity type into the entire surface of the field oxide region, using the oxidation passivation layer pattern as an ion implantation mask;

(e) forming an ion implantation mask pattern defining a field region of the second conductivity type overlying the oxidation passivation layer pattern;

(f) implanting impurity ions of the second conductivity type, using the ion implantation mask pattern;

(g) removing the ion implantation mask pattern; and (h) forming a field oxide layer by annealing, using the oxidation passivation layer pattern and simultaneously forming a field region of the first conductivity type and a field region of the second conductivity type, wherein the step of forming the buried layers of the first and the second conductivity types comprises the substeps of:

forming buried layers of the second conductivity type within the semiconductor substrate in a first predefined pattern;

implanting impurities of the first conductivity type into the semiconductor substrate in a second predefined pattern, the second pattern including areas of the semiconductor region adjacent the first predefined pattern and areas of the semiconductor region corresponding to a region where a double diffused MOS transistor is to be formed; and diffusing the impurities of the first conductivity type to form buried layers of the first conductivity type, wherein one of the buried layers of the first conductivity type, formed in the area corresponding to the region where the double diffused MOS transistor is to be formed, is located below one of the buried layers of the second conductivity type.

2. The method of claim 1, wherein the impurities of the second conductivity type are arsenic, and the implantation concentration is $3\times10^{15}$~$5\times10^{15}$ atoms/cm$^2$.

3. The method of claim 1, wherein the impurities of the first conductivity type are boron, and the implantation concentration is $1\times10^{14}$~$3\times10^{14}$ atoms/cm$^2$.

4. A method for fabricating a BiCDMOS device where bipolar, MOS and double diffused MOS devices are formed on a single semiconductor substrate, comprising the steps of:

(a) forming a semiconductor region of a second conductivity type on the semiconductor substrate of a first conductivity type;

(b) forming well regions of the first conductivity type and well regions of the second conductivity type within the semiconductor region in a predefined arrangement;

(c) forming an oxidation passivation layer pattern overlying the well regions, the passivation layer pattern defining a field oxide region where a field oxide layer will subsequently be formed;

(d) implanting impurity ions of the first conductivity type into the entire surface of the field oxide region, using the oxidation passivation layer pattern as an ion implantation mask;

(e) forming an ion implantation mask pattern defining a field region of the second conductivity type overlying the oxidation passivation layer pattern;

(f) implanting impurity ions of the second conductivity type, using the ion implantation mask pattern;

(g) removing the ion implantation mask pattern;

(h) forming a field oxide layer by annealing, using the oxidation passivation layer pattern and simultaneously forming a field region of the first conductivity type and a field region of the second conductivity type;

(i) forming a gate conductive layer on a semiconductor substrate where a double diffused MOS transistor is to be formed, interposing an insulating layer between the gate conductive layer and the semiconductor substrate, after forming the field oxide layer;

(j) forming a body region of the second conductivity type in the well region of the first conductivity type, and a body region of the first conductivity type in the well region of the second conductivity type;

(k) forming a gate conductive layer on a semiconductor substrate where an MOS transistor of a high voltage and a complementary MOS transistor are to be formed, interposing an insulating layer between the gate conductive layer and the semiconductor substrate;

(l) forming a base region in the well region where a bipolar transistor is to be formed;

(m) forming source and drain regions of the first conductivity type in the well region where the double diffused MOS transistor, the MOS transistor of a high voltage and the complementary MOS transistor are to be formed and an emitter region and a collector region of the bipolar transistor in the well where the bipolar transistor is to be formed; and (n) forming source and drain electrodes of the double diffused MOS transistor, the MOS transistor of a high voltage and the complementary MOS transistor, and a base electrode, an emitter electrode and a collector electrode of the bipolar transistor.

5. The method of claim 4, further comprising the steps of:

coating a photoresist layer on the resultant structure after the step of forming the body regions;

forming a photoresist layer pattern in the photoresist layer, said photoresist layer pattern exposing a channel region of the high voltage MOS transistor and a complementary MOS transistor, using a predetermined mask; and implanting impurity ions, using the photoresist layer pattern as an ion implantation mask.

6. The method of claim 5, wherein a CGOX mask is used for the mask.

* * * * *